(12) United States Patent
Kim et al.

(10) Patent No.: US 11,735,694 B2
(45) Date of Patent: Aug. 22, 2023

(54) SEMICONDUCTOR LIGHT EMITTING DEVICE AND SEMICONDUCTOR LIGHT EMITTING PACKAGE

(71) Applicant: SAMSUNG ELECTRONICS CO., LTD., Suwon-si (KR)

(72) Inventors: Jae-Yoon Kim, Yongin-si (KR); Sungjoon Kim, Yongin-si (KR); Sanghyun Kim, Goyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 190 days.

(21) Appl. No.: 16/908,921

(22) Filed: Jun. 23, 2020

(65) Prior Publication Data

US 2021/0143300 A1    May 13, 2021

(30) Foreign Application Priority Data

Nov. 12, 2019  (KR) .................. 10-2019-0143905

(51) Int. Cl.
*H01L 33/38* (2010.01)
*H01L 25/075* (2006.01)
*H01L 33/32* (2010.01)

(52) U.S. Cl.
CPC ........ *H01L 33/382* (2013.01); *H01L 25/0753* (2013.01); *H01L 33/32* (2013.01)

(58) Field of Classification Search
CPC ... H01L 33/382; H01L 25/0753; H01L 33/32; H01L 33/62; H01L 27/156; H01L 33/38; H01L 33/0008; H01L 33/20
See application file for complete search history.

(56) References Cited

U.S. PATENT DOCUMENTS

| | | | |
|---|---|---|---|
| 5,566,372 | A | 10/1996 | Ikeda et al. |
| 5,717,417 | A | 2/1998 | Takahashi |
| 8,933,624 | B2 | 1/2015 | Koyama |
| 9,253,843 | B2 | 2/2016 | Lee et al. |
| 9,801,246 | B2 | 10/2017 | Rodinger et al. |
| 2007/0251566 | A1 | 11/2007 | Ouchida et al. |

(Continued)

FOREIGN PATENT DOCUMENTS

| | | |
|---|---|---|
| CN | 201093370 Y | 7/2008 |
| JP | 2006-228531 A | 8/2006 |

*Primary Examiner* — Su C Kim
(74) *Attorney, Agent, or Firm* — Sughrue Mion, PLLC

(57) ABSTRACT

Semiconductor light emitting devices and packages are provided. The semiconductor light emitting device includes a substrate, a luminous structure, and first and second electrodes. The substrate has a first region and a second region that is spaced apart in a first direction from the first region. The luminous structure includes a first semiconductor layer, an active layer, and a second semiconductor layer that are sequentially stacked on the substrate. The first electrode is on the second semiconductor layer. The second electrode is electrically coupled to the first semiconductor layer through plural first openings that penetrate the first electrode, the second semiconductor layer, and the active layer, where the first openings expose the first semiconductor layer. The first electrode is in contact with the second semiconductor layer in the first region and in the second region, and the first openings are in the first region.

17 Claims, 16 Drawing Sheets

(56) References Cited

U.S. PATENT DOCUMENTS

| | | | |
|---|---|---|---|
| 2014/0159063 A1* | 6/2014 | Odnoblyudov | H01L 33/06 438/460 |
| 2015/0280086 A1* | 10/2015 | Jang | H01L 33/405 257/88 |
| 2017/0196058 A1 | 7/2017 | Morneau | |
| 2017/0288088 A1* | 10/2017 | Won Cheol | H01L 33/507 |
| 2018/0301597 A1* | 10/2018 | Park | H01L 33/382 |
| 2018/0323341 A1* | 11/2018 | Koo | H01L 33/36 |

* cited by examiner

SEMICONDUCTOR LIGHT EMITTING DEVICE AND SEMICONDUCTOR LIGHT EMITTING PACKAGE

CROSS-REFERENCE TO RELATED APPLICATION

This U.S. nonprovisional application claims priority under 35 U.S.C § 119 to Korean Patent Application No. 10-2019-0143905 filed on Nov. 12, 2019, in the Korean Intellectual Property Office, the disclosure of which is hereby incorporated by reference in its entirety.

BACKGROUND

1. Field

The present disclosure relates to a semiconductor light emitting device and a semiconductor light emitting package.

2. Description of Related Art

Semiconductor light emitting devices, such as light emitting diodes (LEDs), are apparatuses in which light is released from materials included therein. Light emitting devices emit light converted from energy due to recombination of electrons and holes contained in combined semiconductors. Such light emitting diodes (LEDs) are currently in widespread use as illumination, display devices, and light sources, and development thereof has been accelerated.

In particular, general illumination has recently been actively studied due to the development and commercially widespread use of devices, such as mobile phone keypads, turn signal lamps, and camera flashes, which use GaN-based light emitting diodes. General illumination applications such as backlight units of large-sized TVs, automotive headlights, general lightings have moved from small portable products to larger, high powered, and more efficient products, which trend requires light sources that have necessary characteristics for such appliances.

SUMMARY

It is an aspect to provide a semiconductor light emitting device and package with gradation effect.

According to an aspect of some example embodiments, there is provided a semiconductor light emitting device comprising a substrate having a first region and a second region that is spaced apart in a first direction from the first region; a luminous structure including a first semiconductor layer, an active layer, and a second semiconductor layer that are sequentially stacked on the substrate; a first electrode on the second semiconductor layer; and a second electrode electrically coupled to the first semiconductor layer through a plurality of first openings that penetrate the first electrode, the second semiconductor layer, and the active layer, the first openings exposing the first semiconductor layer, wherein the first electrode is in contact with the second semiconductor layer in the first region and in the second region, and wherein the first openings are in the first region.

According to another aspect of some example embodiments, there is provided a semiconductor light emitting device comprising a luminous structure including a first semiconductor layer, an active layer, and a second semiconductor layer that are sequentially stacked, wherein the luminous structure has a first region and a second region that is spaced apart in a first direction from the first region; a first electrode on the second semiconductor layer, wherein the first electrode and the second semiconductor layer are in contact with each other to constitute a first contact; and a plurality of second electrodes that penetrate the second semiconductor layer and the active layer in the first region, wherein the second electrodes and the first semiconductor layer are in contact with each other to constitute a plurality of second contacts, wherein, when viewed in plan view, a sum of areas of the second electrodes per unit area in the first region gradually decreases in the first direction.

According to another aspect of some example embodiments, there is provided a semiconductor light emitting package comprising a substrate; a first semiconductor light emitting device on the substrate; and a second semiconductor light emitting device on the substrate, the second semiconductor light emitting device being adjacent in a first direction to the first semiconductor light emitting device, wherein the first semiconductor light emitting device includes a first luminous structure that includes a first semiconductor layer, a first active layer, and a second semiconductor layer, the first luminous structure having a first region that is adjacent to the second semiconductor light emitting device and a second region that is located in the first direction on one side of the first region; a first electrode on the second semiconductor layer; and a plurality of second electrodes in the first region, the second electrodes being in a plurality of first openings that penetrate the second semiconductor layer and the first active layer, the first openings exposing the first semiconductor layer, and wherein the second semiconductor light emitting device includes a second luminous structure that includes a third semiconductor layer, a second active layer, and a fourth semiconductor layer; a third electrode on the fourth semiconductor layer; and a plurality of fourth electrodes in a plurality of second openings that penetrate the fourth semiconductor layer and the second active layer, the second openings exposing the third semiconductor layer.

BRIEF DESCRIPTION OF THE DRAWINGS

The above and/or other aspects will become more apparent to those of ordinary skill in the art by describing example embodiments thereof in detail with reference to the accompanying drawings, in which.

DETAILED DESCRIPTION

The following will now describe a semiconductor light emitting device according to various example embodiments with reference to the accompanying drawings.

Figure 1:
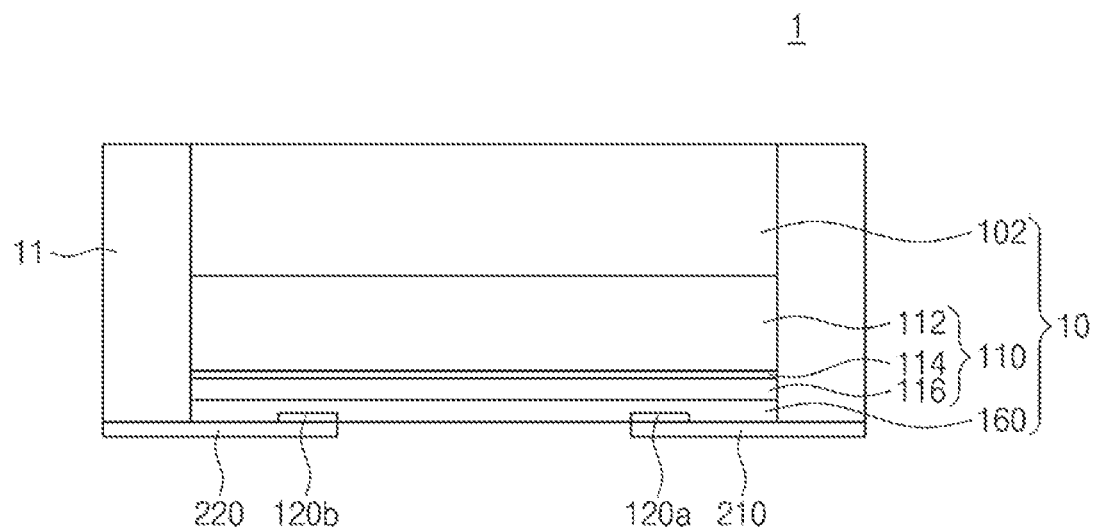
FIG. 1 illustrates a simplified cross-sectional view showing a semiconductor light emitting package according to some example embodiments.

FIG. 1 illustrates a simplified cross-sectional view showing a semiconductor light emitting package according to some example embodiments.

Referring to FIG. 1, a semiconductor light emitting package 1 may include a package main body 11, a first wiring line 210 and a second wiring line 220, and a semiconductor light emitting device 10. The first and second wiring lines 210 and 220 may be lead frames. For example, the first and second wiring lines 210 and 220 may include a first lead frame and a second lead frame, respectively. For another example, the first and second wiring lines 210 and 220 may include pads or conductive patterns.

The semiconductor light emitting device 10 may include an electrode structure 160 and a luminous structure 110 that are vertically disposed. The luminous structure 110 may include a first semiconductor layer 112, a second semiconductor layer 116 whose conductive type is different from that of the first semiconductor layer 112, and an active layer 114 between the first and second semiconductor layers 112 and 116. The luminous structure 110 may be provided thereon with a wavelength conversion layer 102 that changes a wavelength of light generated from the luminous structure 110. The electrode structure 160 may include electrodes that are correspondingly coupled to the first and second semiconductor layers 112 and 116. The electrode structure 160 may also include a first under-bump-metal (UBM) pattern 120a and a second under-bump-metal (UBM) pattern 120b that are electrically connected to the electrodes. Each of the first and second UBM patterns 120a and 120b may be provided in single or plural.

The semiconductor light emitting device 10 may be mounted on the first and second wiring lines 210 and 220. For example, the first UBM pattern 120a may be either directly coupled to the first wiring line 210 or electrically connected to the first wiring line 210 through a terminal such as a bump, and the second UBM pattern 120b may be either directly coupled to the second wiring line 220 or electrically connected to the second wiring line 220 through a terminal such as a bump.

The package main body 11 may include a partition wall or a reflective cup for improvement in light reflection efficiency and light extraction efficiency. For example, the partition wall may be disposed on a lateral surface of the semiconductor light emitting device 10, and may prevent a lateral discharge of light generated from the semiconductor light emitting device 10. For example, the reflective cup may upwardly reflect light generated from the semiconductor light emitting device 10. Differently from that shown in FIG. 1, a plurality of semiconductor light emitting devices 10 may be provided in the package main body 11. For example, the package main body 11 may be configured to include therein an array of the semiconductor light emitting devices 10. The array of the semiconductor light emitting devices 10 will be further discussed in detail below.

An electrical signal applied through the electrode structure 160 may cause recombination of electron-hole in the active layer 114. The wavelength conversion layer 102 may upwardly discharge light caused by the recombination of electron-hole. For example, the semiconductor light emitting device 10 may have a flip-chip structure in which light is discharged through the wavelength conversion layer 102.

Differently from that shown in FIG. 1, the semiconductor light emitting device 10 may be mounted on a mounting substrate and electrically connected to circuit patterns on the mounting substrate. For example, the first and second UBM patterns 120a and 120b may be electrically connected to the circuit patterns through connection terminals such as solder bumps. The mounting substrate may be provided in the form of a PCB, a MCPCB, a MPCB, or a FPCB, but the structure of the mounting substrate may be variously changed. In this case, the semiconductor light emitting device 10 may be encapsulated with an encapsulation layer. This encapsulated configuration may achieve a chip-on-board (COB) type package structure.

In this specification, spatially relative terms such as "below", "beneath", "lower", "above", or "upper" may be used to easily describe one element or component's relationship to another element or component as illustrated in figures. It will be understood that spatially relative terms are intended to encompass different directions of devices when they are used or operated in addition to directions depicted in figures. The following will discuss in detail the semiconductor light emitting device 10 according to some example embodiments.

Figure 2:
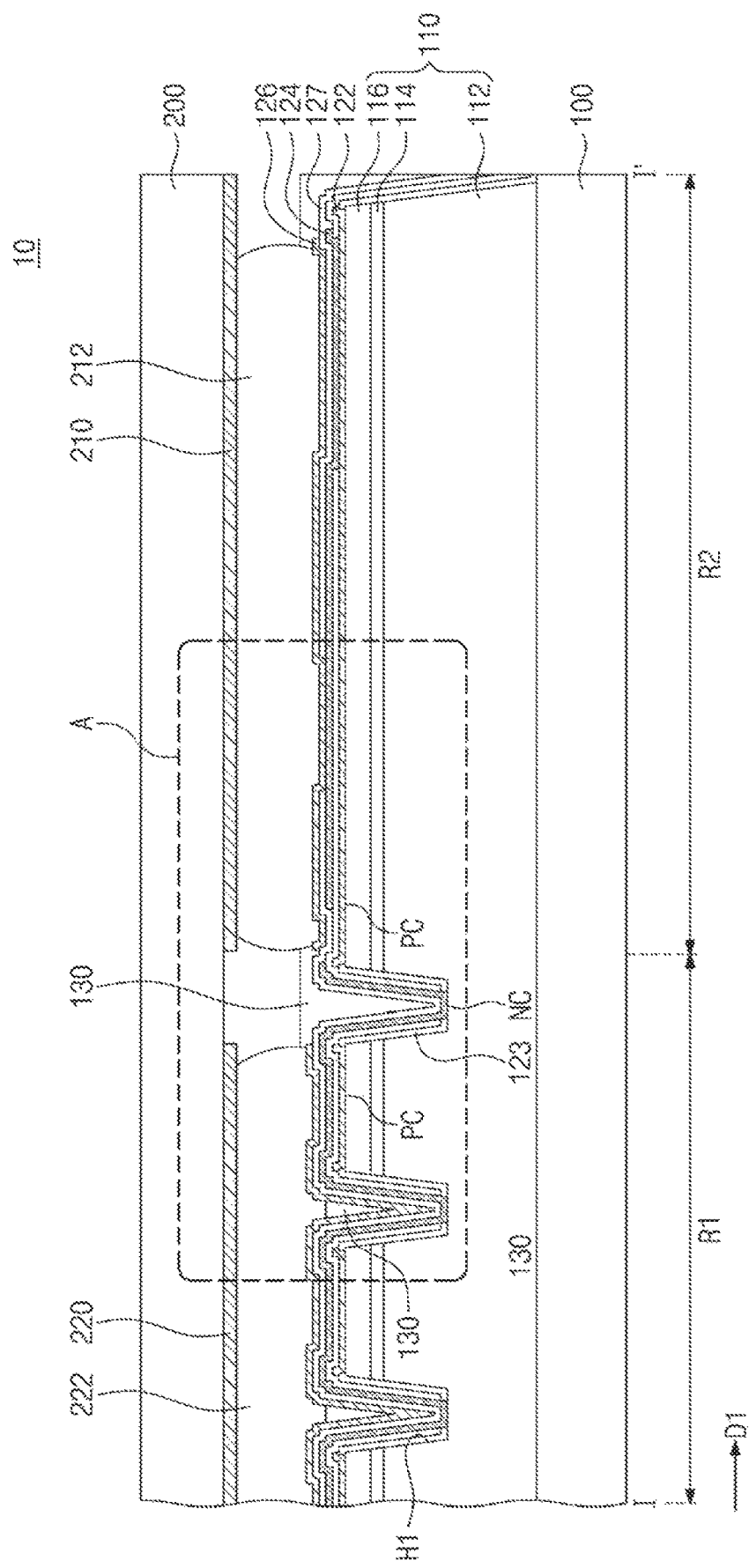
FIG. 2 illustrates a cross-sectional view showing a semiconductor light emitting device according to some example embodiments.
Figure 3:
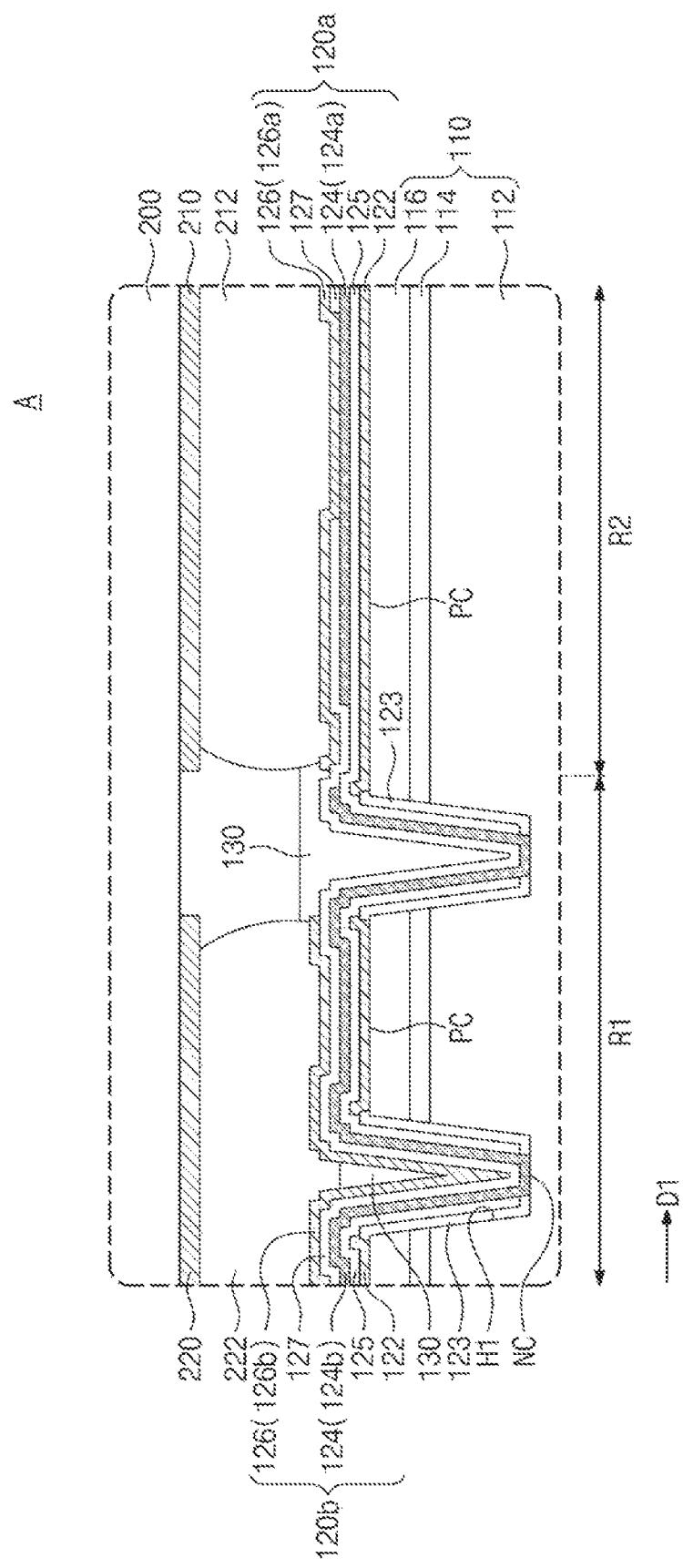
FIG. 3 illustrates an enlarged view showing section A the semiconductor light emitting device of FIG. 2.
Figure 4:
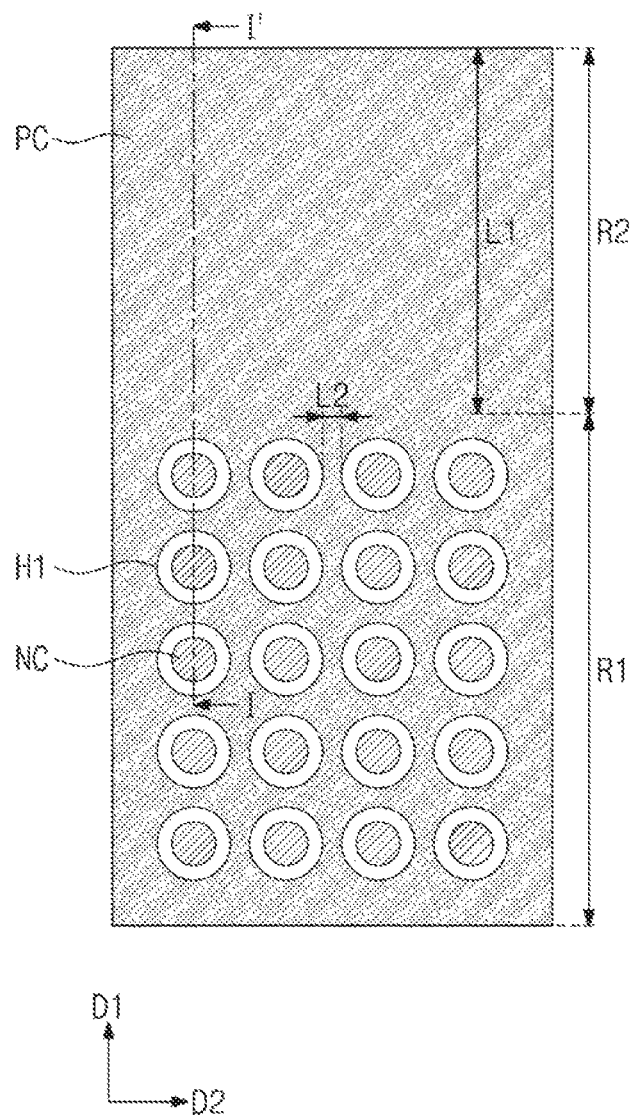
FIGS. 4 to 6 illustrate simplified plan views showing a semiconductor light emitting device according to some example embodiments.
Figure 5:
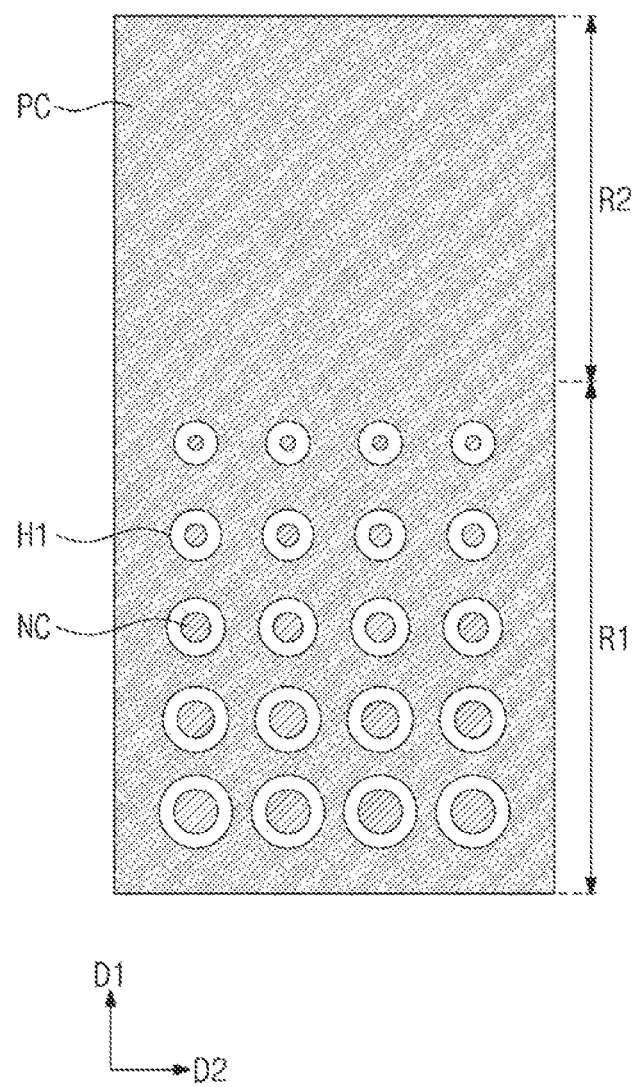
Figure 6:
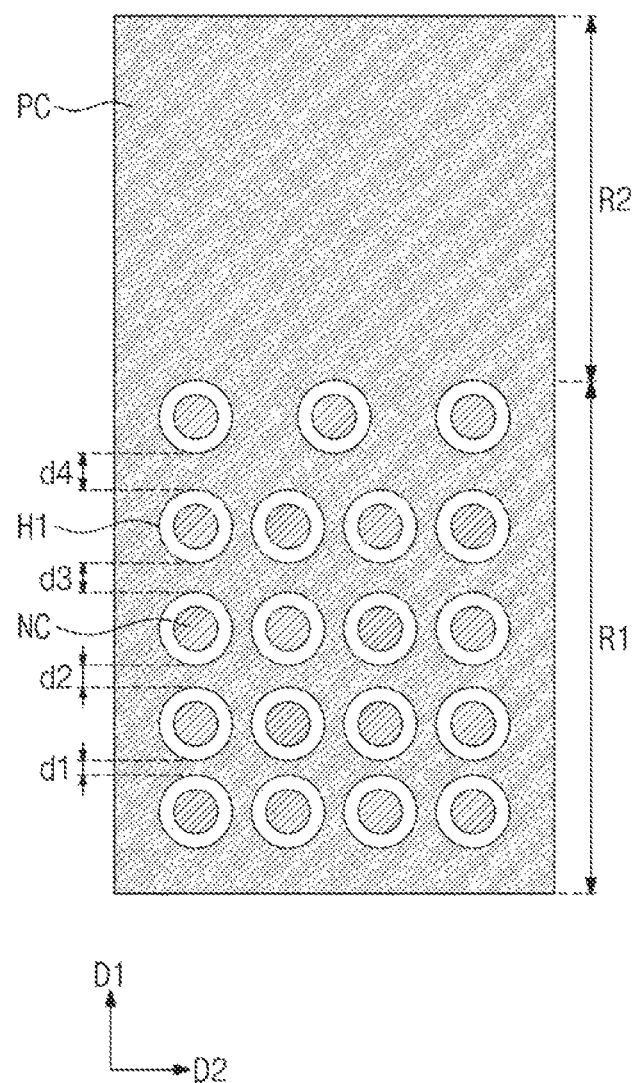

FIG. 2 illustrates a cross-sectional view showing a semiconductor light emitting device according to some example embodiments. FIG. 3 illustrates an enlarged view showing section A of the semiconductor light emitting device of FIG. 2. FIGS. 4 to 6 illustrate simplified plan views showing arrangement of n-contacts and p-contacts of a semiconductor light emitting device according to some example embodiments, and FIG. 2 corresponds to a cross-section taken along line I-I' of FIG. 4.

Referring to FIGS. 2, 3, and 4, a semiconductor light emitting device 10 may include a growth substrate 100 and a luminous structure 110 which includes a first semiconductor layer 112, an active layer 114, and a second semiconductor layer 116 which are sequentially stacked on the growth substrate 100. Although not shown, a buffer layer (not shown) may be interposed between the growth substrate 100 and the first semiconductor layer 112. The buffer layer (not shown) may be provided to alleviate a lattice mismatch between the growth substrate 100 and the first semiconductor layer 112. The growth substrate 100 may be a transparent substrate, such as a sapphire substrate. Alternatively, the growth substrate 100 may be a semiconductor substrate, such as a silicon substrate. The growth substrate 100 may have a first region R1 and a second region R2. The first and second regions R1 and R2 may be disposed adjacent to each other in a first direction D1 parallel to a top surface of the growth substrate 100.

The first semiconductor layer 112 may include a semiconductor doped with n-type impurities. For example, the first semiconductor layer 112 may be an n-type semiconductor nitride layer. The second semiconductor layer 116 may include a semiconductor doped with p-type impurities. For example, the second semiconductor layer 116 may be a p-type semiconductor nitride layer. The first and second semiconductor layers 112 and 116 may have a composition of $Al_xIn_yGa_{(1-x-y)}N$ (where, $0 \leq x \leq 1$, $0 \leq y \leq 1$, $0 \leq x+y \leq 1$). For example, the first and second semiconductor layers 112 and 116 may include GaN, AlGaN, InGaN, or AlInGaN. In this case, the n-type impurities may include silicon (Si), and the p-type impurities may include magnesium (Mg).

The active layer 114 may be disposed between the first and second semiconductor layers 112 and 116, and may discharge light whose energy is generated by recombination of electron-holes. The active layer 114 may include a material whose energy bandgap is less than those of the first and second semiconductor layers 112 and 116. For example, when the first and second semiconductor layers 112 and 116 include a GaN-based compound semiconductor, the active layer 114 may include an InGaN-based compound semiconductor whose energy bandgap is less than that of GaN. The active layer 114 may have a multiple quantum well (MQW) structure, such as a structure of InGaN/GaN, in which at least one quantum well layer and at least one quantum barrier layer are alternately stacked. The present inventive concepts, however, are not limited thereto. For another example, the active layer 114 may have a single quantum well (SQW) structure.

The luminous structure 110 may include one or more etching regions and a mesa region. For example, the luminous structure 110 may have one or more first openings H1 that penetrate the second semiconductor layer 116 and the active layer 114 and expose the first semiconductor layer 112, and the etching regions may correspond to areas provided with the first openings H1 that expose the first semiconductor layer 112. The first openings H1 may be located on the first region R1 of the growth substrate 100. For example, as shown in FIG. 4, the first openings H1 may be provided on the first region R1, but not on the second region R2. The first openings H1 may be two-dimensionally disposed on the first region R1. The mesa region may correspond to an area of the luminous structure 110, which area is not etched when the etching regions are formed. For example, the mesa region may be an area where the first openings H1 are not formed. The mesa region may be located on the first and second regions R1 and R2 of the growth substrate 100. The first openings H1 may have inner sidewalls that are downwardly inclined toward the growth substrate 100.

Each of the first openings H1 may be used as a connection path through which the first semiconductor layer 112 is coupled to a second pattern 124b of a second sub-electrode layer 124 which will be discussed below. As noted above, the first openings H1 may be two-dimensionally disposed on the first region R1. For example, the first openings H1 may be disposed along the first direction D1 and along a second direction D2 that intersects (e.g., orthogonal to) the first direction D1, thereby constituting a plurality of rows and columns as illustrated in FIG. 4. The same or different intervals may be provided between the first openings H1 that are adjacent to each other in the first direction D1 or the second direction D2. Widths and arrangement of the first openings H1 may affect current diffusion and light extraction efficiency. Therefore, the widths and arrangement of the first openings H1 may be restricted to improve current diffusion and light extraction efficiency. This will be further discussed below in detail together with n-contacts (NC) and p-contacts (PC).

In other example embodiments, when viewed in plan, a sum of areas of the first openings H1 per unit area may gradually decrease in the first direction D1 as illustrated in FIG. 5.

Referring to FIG. 5, the first openings H1 may be provided with a uniform density, but an area of the first openings H1 may gradually decrease in the first direction D1. The top surface of the first semiconductor layer 112 may have portions exposed to the first openings H1, and the area of the first openings H1 may be defined to refer to an area of the exposed portions of the top surface. The first openings H1 may have widths or diameters that gradually decrease in the first direction D1.

Referring to FIG. 6, a density of the first openings H1 may gradually decrease in the first direction D1. The density of the first openings H1 may be obtained by dividing the number of the first openings H1 provided on an arbitrary region by an area of the arbitrary region. For example, an interval (see d1 to d4 of FIG. 6) between the first openings H1 may gradually increase in the first direction D1. For example, as illustrated in FIG. 6, d1<d2<d3<d4.

Returning to FIG. 4, each of the first openings H1 may have a circular shape when viewed in plan, but example embodiments are not limited thereto. In other example embodiments, each of the first openings H1 may have a polygonal shape, such as a tetragonal shape, when viewed in plan. The second region R2 may have a length L1 in the first direction D1 of about 1.5 to 20 times an interval L2 between the first openings H1. As illustrated in FIG. 2, each of the first openings H1 may have a width that gradually decreases as a distance from the growth substrate 100 decreases.

A first sub-electrode layer 122 may be disposed on the mesa region of the luminous structure 110. The first sub-electrode layer 122 may contact a top surface of the second semiconductor layer 116. The first sub-electrode layer 122 and the second semiconductor layer 116 may contact each other to form a p-contact PC. The first sub-electrode layer 122 may be electrically connected through the p-contact PC to the second semiconductor layer 116. The p-contact PC may be formed on an entire top surface of the luminous structure 110 on the first and second regions R1 and R2 except for where the first openings H1 are formed. The first sub-electrode layer 122 may not extend into the first openings H1. For example, the first sub-electrode layer 122 may have a sidewall spaced apart from the first openings H1, or in some example embodiments differently from that shown in FIG. 2, the sidewall of the first sub-electrode layer 122 may have a continuous profile with inner walls of the first openings H1. The first sub-electrode layer 122 may be a reflective metal layer. The first sub-electrode layer 122 may include a reflective metallic material, such as silver (Ag) or aluminum (Al). For example, the first sub-electrode layer 122 may include silver (Ag).

A first dielectric layer 123 may be disposed on the luminous structure 110. The first dielectric layer 123 may cover inner and an a portion of bottom surfaces of the first openings H1. For example, the first dielectric layer 123 may cover a lateral surface of the first semiconductor layer 112, a lateral surface of the active layer 114, and a lateral surface of the second semiconductor layer 116. The first dielectric layer 123 may include a dielectric material. The first dielectric layer 123 may be a single layer including a dielectric material, such as a silicon oxide ($SiO_2$) layer, a titanium oxide ($TiO_2$) layer, or a niobium oxide ($Nb_2O_5$) layer.

A second dielectric layer 125 may be disposed on the mesa region and the etching regions of the luminous structure 110. The second dielectric layer 125 may conformally cover the luminous structure 110. For example, the second dielectric layer 125 may cover the first sub-electrode layer 122, and may extend into the first opening H1 and cover the first dielectric layer 123. The second dielectric layer 125 may include a dielectric material. The second dielectric layer 125 may be a single layer including a dielectric material, such as a silicon oxide ($SiO_2$) layer, a titanium oxide ($TiO_2$) layer, or a niobium oxide ($Nb_2O_5$) layer.

A second sub-electrode layer 124 may be disposed on the luminous structure 110. The second sub-electrode layer 124 may cover a top surface of the second dielectric layer 125. The second sub-electrode layer 124 may have a first pattern 124a and a second pattern 124b that are insulated from each other. FIG. 3 shows that the first pattern 124a is provided on the second region R2 and the second pattern 124b is provided on the first region R1, but example embodiments are not limited thereto. The first and second patterns 124a and 124b may be provided at various positions depending on wiring line locations of the semiconductor light emitting device 10. The first and second patterns 124a and 124b may be spaced apart from each other and thus insulated from each other. On the luminous structure 110, the first pattern 124a may penetrate the second dielectric layer 125 and may be coupled to the first sub-electrode layer 122 (best illustrated in FIG. 2). On the luminous structure 110, the second pattern 124b may extend into the first opening H1. In the first opening H1, the second pattern 124b may penetrate the first and second dielectric layers 123 and 125 and may be coupled to the first semiconductor layer 112. The second sub-electrode layer 124 may include a metallic material, such as aluminum (Al), chromium (Cr), titanium (Ti), copper (Cu), or an alloy thereof. In other example embodiments, the second sub-electrode layer 124 may be a reflective metal layer. The second sub-electrode layer 124 may include a reflective metallic material, such as silver (Ag) or aluminum (Al). For example, the second sub-electrode layer 124 may include silver (Ag).

The second sub-electrode layer 124 and the first semiconductor layer 112 may contact each other to form n-contacts NC. The second sub-electrode layer 124 may be electrically connected through the n-contacts NC to the first semiconductor layer 112. Depending on a position of the first opening H1, the n-contacts NC may be located on the etching regions. For example, as shown in FIG. 4, the n-contacts NC may be provided on the first region R1, but not on the second region R2. The n-contacts NC may be two-dimensionally disposed on the first region R1. For example, the n-contacts NC may be disposed along the first and second directions D1 and D2 to constitute a plurality of rows and columns. In this configuration, the same or different intervals may be provided between the n-contacts NC that are adjacent to each other in the first direction D1 or the second direction D2. Widths and arrangement of the n-contacts NC may affect current diffusion and light extraction efficiency.

The widths and arrangement of the n-contacts NC may be restricted to improve current diffusion and light extraction efficiency. For example, the semiconductor light emitting device 10 may be configured such that power applied from the p-contact PC and the n-contacts NC is used to generate light from the luminous structure 110 between the p-contact PC and the n-contacts NC. According to various example embodiments, the p-contact PC may be formed on the entire top surface of the luminous structure 110 on the first and second regions R1 and R2 except for where the first openings H1 are formed, and the n-contacts NC may be provided with a uniform density on the first region R1. The length L1 in the first direction D1 of the second region R2 may be about 1.5 to 20 times the interval L2 between the n-contacts NC. In this configuration, because the n-contacts NC are not disposed on the second region R2, the luminous structure 110 on the second region R2 may be supplied with power whose magnitude decreases with increasing distance from the n-contacts NC. For example, on the second region R2, the magnitude of power applied to the luminous structure 110 may gradually decrease in the first direction D1 as a distance from the first region R1 increases. Therefore, the luminous structure 110 may generate light with a brightness that is uniform on the first region R1 and that gradually decreases in the first direction D1 on the second region R2. Accordingly, the semiconductor light emitting device 10 may have a gradation effect on the second region R2. In this sense, according to various example embodiments, even when there is no power control based on position, widths and arrangement of the n-contacts NC and the p-contact PC may be used to achieve the gradation effect.

In order to reinforce the gradation effect of the semiconductor light emitting device 10, a sum of areas of the n-contacts NC per unit area on the first region R1 may gradually decrease in the first direction D1 as illustrated in FIG. 5.

Referring back to FIG. 5, the n-contacts NC may be provided with a uniform density on the first region R1, but an area of the n-contacts NC may gradually decrease in the first direction D1. For example, on the first region R1, an interface resistance between the second sub-electrode layer 124 and the first semiconductor layer 112 may gradually increase in the first direction D1, and thus a magnitude of power applied to the luminous structure 110 may gradually decrease in the first direction D1.

Referring back to FIG. 6, as discussed above, density of the first openings H1 may gradually decrease in the first direction D1, and thus a density of the n-contacts NC in the first openings H1 may gradually decrease in the first direction D1. For example, on the first region R1, an interval between the n-contacts NC may gradually increase in the first direction D1. Therefore, on the first region R1, a magnitude of power applied to the luminous structure 110 may gradually decrease in the first direction D1.

The following description will focus mainly on the example embodiment of FIG. 4.

A third dielectric layer 127 may be disposed on the luminous structure 110. The third dielectric layer 127 may conformally cover the luminous structure 110. The third dielectric layer 127 may cover the second sub-electrode layer 124. For example, the third dielectric layer 127 may partially cover the first pattern 124a of the second sub-electrode layer 124, the second pattern 124b of the second sub-electrode layer 124, and the second dielectric layer 125 that is exposed between the first and second patterns 124a and 124b. The third dielectric layer 127 may include a dielectric material. The third dielectric layer 127 may be a single layer including a dielectric material, such as a silicon oxide ($SiO_2$) layer, a titanium oxide ($TiO_2$) layer, or a niobium oxide ($Nb_2O_5$) layer.

A third sub-electrode layer 126 may be disposed on the luminous structure 110. The third sub-electrode layer 126 may cover a top surface of the third dielectric layer 127. The third sub-electrode layer 126 may have a third pattern 126a and a fourth pattern 126b that are insulated from each other (as illustrated in FIG. 3). The third and fourth patterns 126a and 126b may be spaced apart from each other and thus insulated from each other. The third pattern 126a may be disposed above the first pattern 124a of the second sub-electrode layer 124. The third pattern 126a may penetrate the third dielectric layer 127 and may be coupled to the first pattern 124a. The third pattern 126a may be coupled to the second semiconductor layer 116 through the first pattern 124a and the first sub-electrode layer 122 (best illustrated in FIG. 2). The fourth pattern 126b may be disposed above the second pattern 124b of the second sub-electrode layer 124. The fourth pattern 126b may penetrate the third dielectric layer 127 and may be coupled to the second pattern 124b. The fourth pattern 126b may be coupled through the second pattern 124b to the first semiconductor layer 112. The third sub-electrode layer 126 may include a metallic material, such as aluminum (Al), chromium (Cr), titanium (Ti), copper (Cu), or an alloy thereof.

The first sub-electrode layer 122, the first pattern 124a of the second sub-electrode layer 124, and the third pattern 126a of the third sub-electrode layer 126 may constitute the first UBM pattern 120a discussed with reference to FIG. 1. The first UBM pattern 120a may provide the second semiconductor layer 116 with electrical signals from an external circuit. The second pattern 124b of the second sub-electrode layer 124 and the fourth pattern 126b of the third sub-electrode layer 126 may constitute the second UBM pattern 120b discussed with reference to FIG. 1. The second UBM pattern 120b may provide the first semiconductor layer 112 with electrical signals from an external circuit. The first sub-electrode layer 122, the first dielectric layer 123, the second sub-electrode layer 124, the second dielectric layer 125, the third sub-electrode layer 126, and the third dielectric layer 127 may constitute the electrode structure 160 discussed with reference to FIG. 1.

A buried layer 130 may be disposed on the luminous structure 110. The buried layer 130 may cover the luminous structure 110. On the luminous structure 110, the buried layer 130 may cover the third sub-electrode layer 126 and the third dielectric layer 127. In addition, the buried layer 130 may fill an unoccupied portion of the first opening H1. The buried layer 130 may partially expose a top surface of the third pattern 126a of the third sub-electrode layer 126 and a top surface of the fourth pattern 126b of the third sub-electrode layer 126. The buried layer 130 may include a dielectric material such as an epoxy molding compound (EMC) or a passivation dielectric layer such as a silicon oxide layer and/or a silicon nitride layer.

The semiconductor light emitting device 10 may be provided as discussed above. The semiconductor light emitting device 10 may be mounted on a mounting substrate 200. The mounting substrate 200 may be a package substrate or a motherboard of an external device. The mounting substrate 200 may be a printed circuit board (PCB). The mounting substrate 200 may have the first wiring line 210 and the second wiring line 220. The first and second wiring lines 210 and 220 may be a conductive pad as shown in FIGS. 2 and 3. The first and second wiring lines 210 and 220 may include a single metal or an alloy including one or more of titanium (Ti), tungsten titanium (TiW), chromium (Cr), copper (Cu), nickel (Ni), gold (Au), lead (Pb), and silver (Ag). Alternatively, the first and second wiring lines 210 and 220 may be lead frames as discussed with reference to FIG. 1.

A first conductor 212 and a second conductor 222 may be used to mount the semiconductor light emitting device 10 on the mounting substrate 200. The first conductor 212 may be interposed between the first wiring line 210 and the first UBM pattern 120a, or between the first wiring line 210 and the third pattern 126a of the third sub-electrode layer 126. The second conductor 222 may be interposed between the second wiring line 220 and the second UBM pattern 120b, or between the second wiring line 220 and the fourth pattern 126b of the third sub-electrode layer 126. The first and second conductors 212 and 222 may include a coupling terminal, such as a solder bump or a plug.

FIG. 2 shows that the luminous structure 110 is provided on the growth substrate 100, but example are not limited thereto. In some example embodiments, instead of the growth substrate 100, a wavelength conversion layer may be provided on one surface of the first semiconductor layer 112 of the luminous structure 110. When the semiconductor light emitting device 10 operates, the wavelength conversion layer may convert light emitted from the semiconductor light emitting device 10 into a desired wavelength. The wavelength conversion layer may include a wavelength conversion material. The wavelength conversion material may convert light having a wavelength generated from the semiconductor light emitting device 10. For example, the wavelength conversion material may include a quantum-dot fluorescent material, which has a nano-sized particle. The quantum-dot fluorescent material may use a III-V or II-VI compound semiconductor to have a core-shell structure. For example, the core may include CdSe and/or InP. The shell may include ZnS and/or ZnSe. In addition, the quantum-dot fluorescent material may include a ligand to increase stability of the core and the shell. For another example, additional wavelength conversion particles may further be provided on an upper portion of the wavelength conversion layer.

Figure 7:
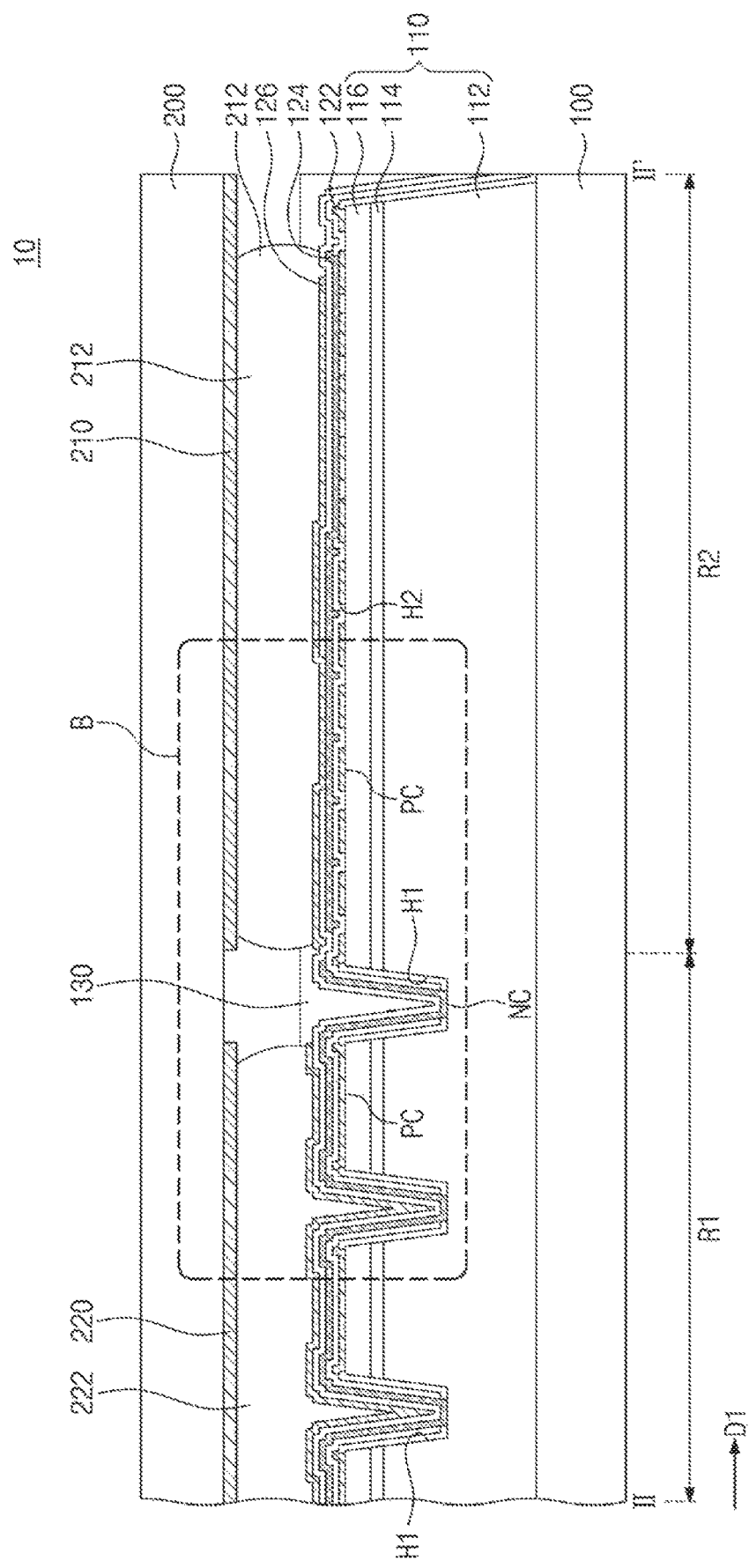
FIG. 7 illustrates a cross-sectional view showing a semiconductor light emitting device according to some example embodiments.
Figure 8:
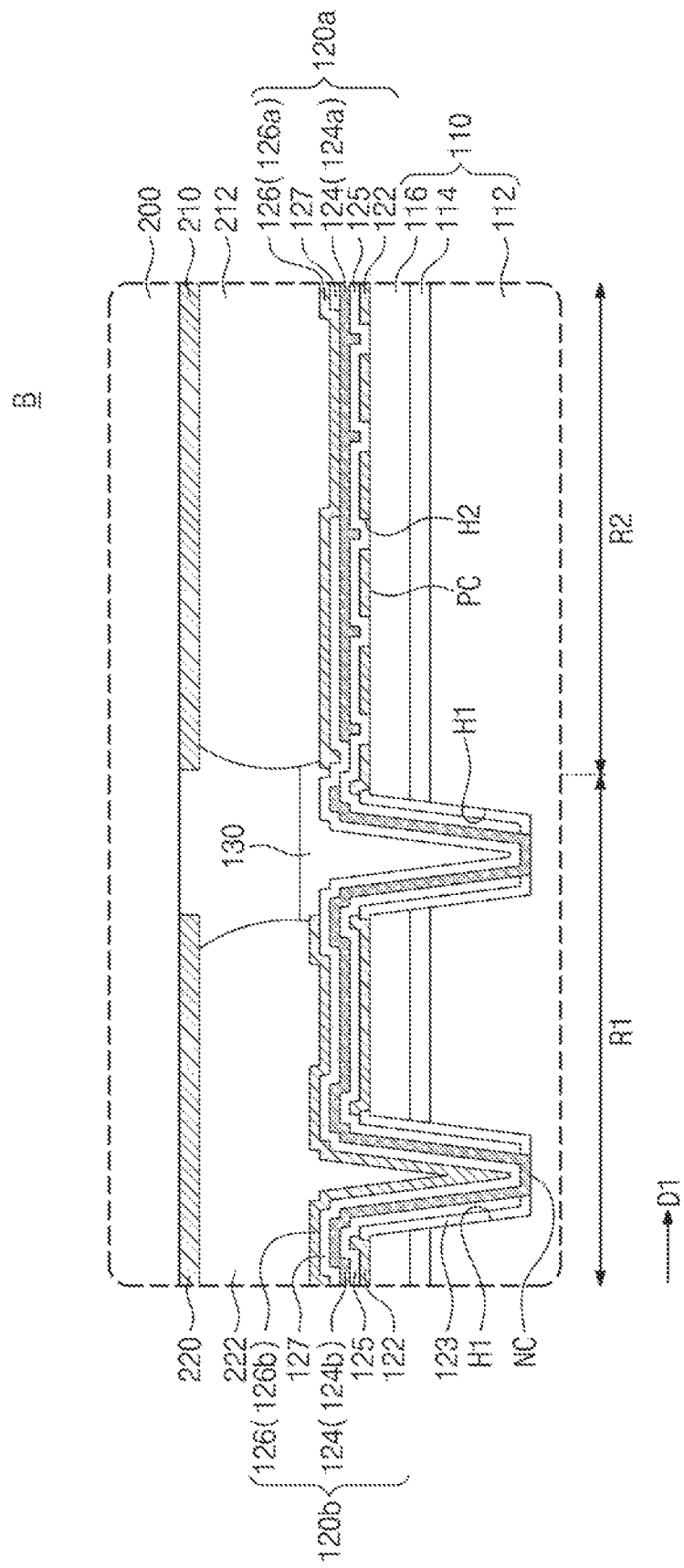
FIG. 8 illustrates an enlarged view showing section B of the semiconductor light emitting device of FIG. 7.
Figure 9:
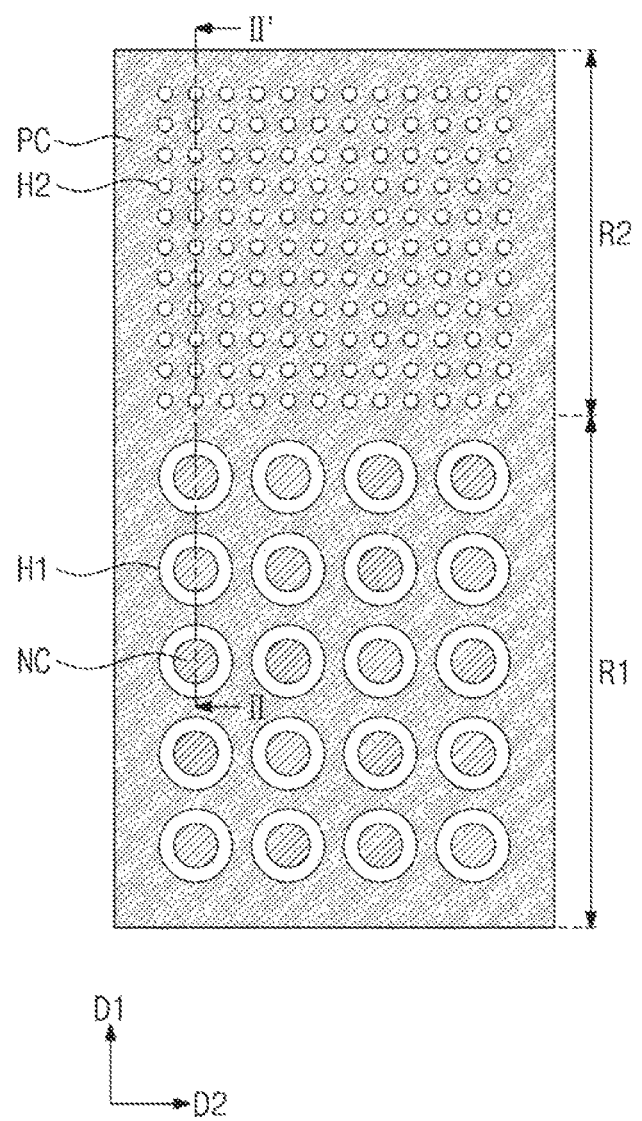
FIG. 9 illustrates a simplified plan view showing a semiconductor light emitting device according to some example embodiments.

FIG. 7 illustrates a cross-sectional view showing a semiconductor light emitting device according to some example embodiments. FIG. 8 illustrates an enlarged view showing section B of FIG. 7. FIG. 9 illustrates a simplified plan view showing arrangement of n-contacts and p-contacts of a semiconductor light emitting device according to some example embodiments, and FIG. 7 corresponds to a cross-section taken along line II-II' of FIG. 9. In the example embodiments that follow, components that are the same as those of the example embodiments discussed with reference to FIGS. 2 to 6 are allocated the same reference numerals, and a repetitive explanation thereof will be omitted or abridged for conciseness and convenience of description. The following will mainly describe differences between the example embodiments of FIGS. 2 and 6 and other example embodiments described below.

Referring to FIGS. 7 to 9, the first sub-electrode layer 122 may be disposed on the luminous structure 110. The first sub-electrode layer 122 may contact the top surface of the second semiconductor layer 116. The first sub-electrode layer 122 and the second semiconductor layer 116 may contact each other to form the p-contact PC. The first sub-electrode layer 122 may be electrically connected through the p-contact PC to the second semiconductor layer 116. The p-contact PC may be formed on the entire top surface of the luminous structure 110 on the first and second regions R1 and R2 except for where the first openings H1 are formed.

The first sub-electrode layer 122 may have a plurality of second openings H2. The second openings H2 may have open hole shapes that completely penetrate the first sub-electrode layer 122. The second openings H2 may be disposed on the second region R2 of the growth substrate 100. For example, as shown in FIG. 9, the second openings H2 may be provided on the second region R2, but not on the first region R1. The second openings H2 may be two-dimensionally disposed on the second region R2. For example, the second openings H2 may be arranged along the first and second directions D1 and D2 to constitute a plurality of rows and columns. The same or different intervals may be provided between the second openings H2 that are adjacent to each other in the first direction D1 and the second direction D2. The second openings H2 may have circular shapes when viewed in plan view, but example embodiments are not limited thereto. In other example embodiments, the second openings H2 may have polygonal shapes, such as tetragonal shapes, and/or may have linear shapes that extend in one direction and are arranged in a different direction from the one direction. Because the second openings H2 are provided only on the second region R2, an area of the p-contact PC may be greater on the first region R1 than on the second region R2. Therefore, a magnitude of power applied to the luminous structure 110 on the second region R2 may be less than that of power applied to the luminous structure 110 on the first region R1, and the semiconductor light emitting device 10 may have a gradation effect on the second region R2.

FIG. 9 shows that the second openings H2 are uniformly provided, but example embodiments are not limited thereto. In order to reinforce the gradation effect of the semiconductor light emitting device 10, each area of the second openings H2 may gradually increase in the first direction D1 on the second region R2, or the number of the second openings H2 per unit area on the second region R2 may gradually increase in the first direction D1.

The second openings H2 may be filled with either the second dielectric layer 125 that extends thereinto or a separate dielectric material.

Figure 10:
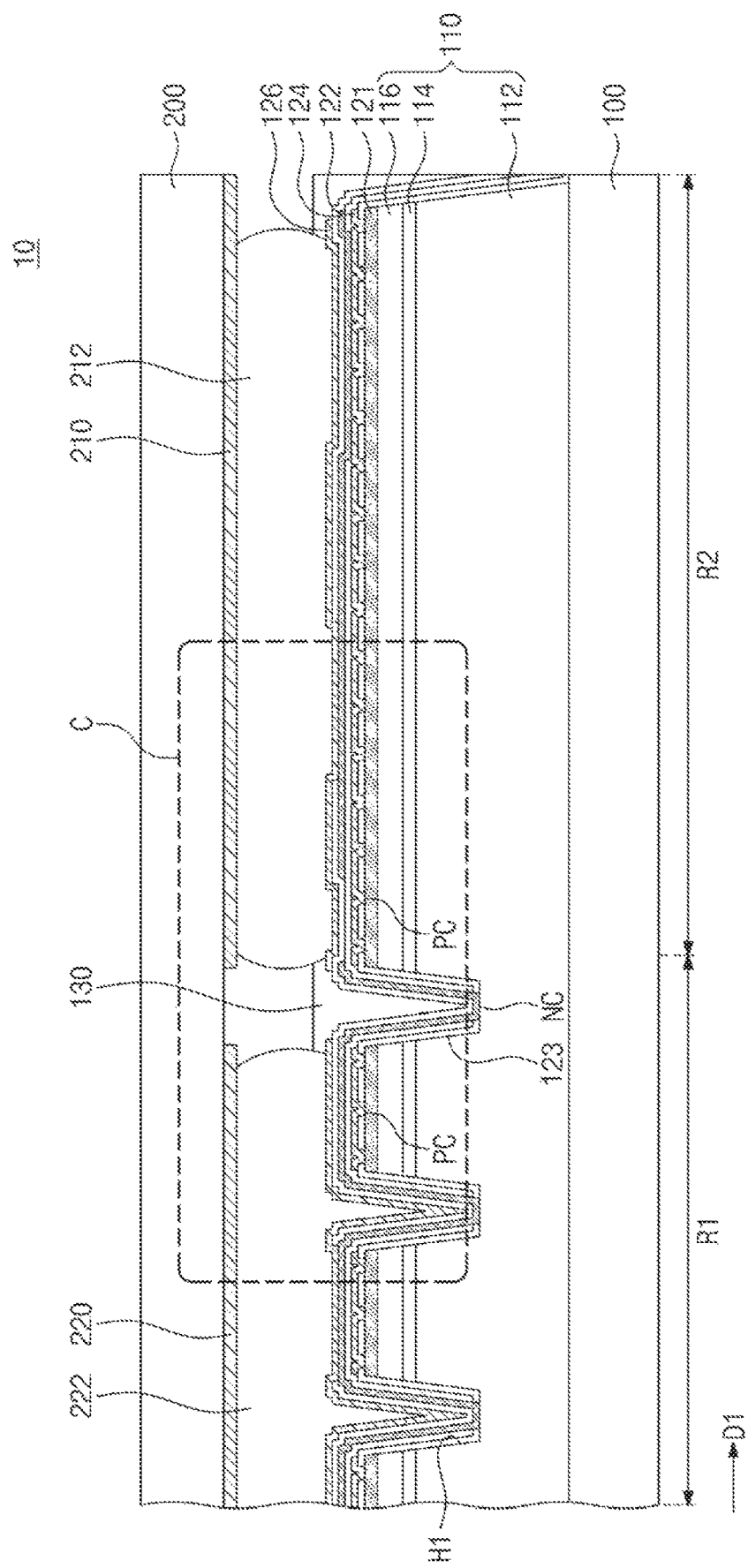
FIG. 10 illustrates a cross-sectional view showing a semiconductor light emitting device according to some example embodiments.
Figure 11:
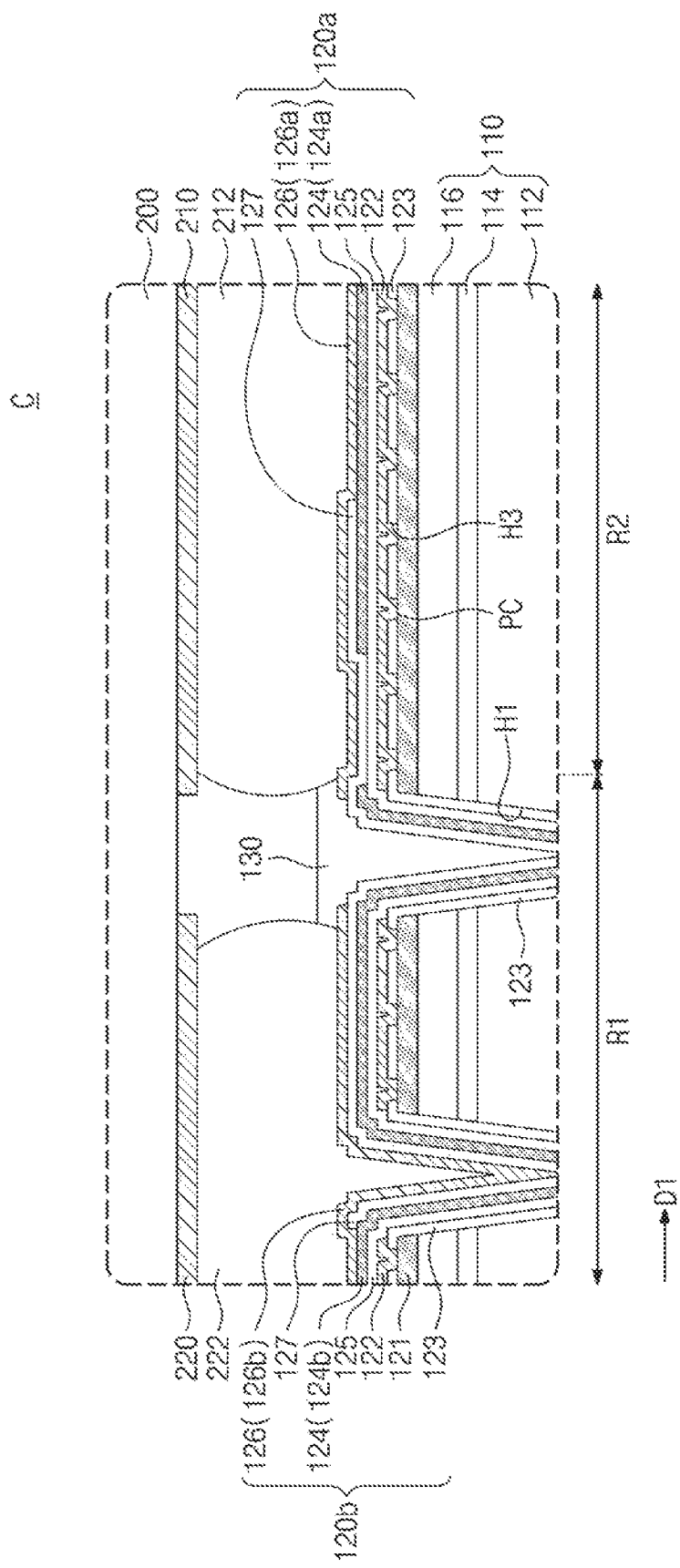
FIG. 11 illustrates an enlarged view showing section C of the semiconductor light emitting device of FIG. 10.

FIG. 10 illustrates a cross-sectional view showing a semiconductor light emitting device according to some example embodiments. FIG. 11 illustrates an enlarged view showing section C of FIG. 10.

Referring to FIGS. 10 and 11, a transparent electrode layer 121 may be interposed between the luminous structure 110 and the first sub-electrode layer 122. The transparent electrode layer 121 may contact the top surface of the second semiconductor layer 116. The transparent electrode layer 121 and the second semiconductor layer 116 may contact each other to form the p-contact PC. The transparent electrode layer 121 may be electrically connected through the p-contact PC to the second semiconductor layer 116. The p-contact PC may be formed on the entire top surface of the luminous structure 110 on the first and second regions R1 and R2 except for where the first openings H1 are formed. The transparent electrode layer 121 may not extend into the first openings H1. For example, in some example embodiments, a sidewall of the transparent electrode layer 121 may have a continuous profile with the inner walls of the first openings H1, or differently from that shown in FIGS. 10 and 11, according to some example embodiments, the sidewall of the transparent electrode layer 121 may be spaced apart from the first openings H1. The transparent electrode layer 121 may include a transparent conductive oxide, such as indium tin oxide (ITO), indium zinc oxide (IZO), or indium tin zinc oxide (ITZO).

The first dielectric layer 123 may extend between the transparent electrode layer 121 and the first sub-electrode layer 122. The first dielectric layer 123 may have a plurality of third openings H3. The third openings H3 may each have an open hole shape that completely penetrates the first dielectric layer 123. The third openings H3 may penetrate the first dielectric layer 123 on the mesa region of the luminous structure 110 and may expose a top surface of the first sub-electrode layer 122. The third openings H3 may be used as connection paths through which the first sub-electrode layer 122 is coupled to the transparent electrode layer 121.

The first dielectric layer 123 may include a dielectric material whose refractive index less than that of the second semiconductor layer 116. The first dielectric layer 123 may be a single layer including a dielectric material, such as a silicon oxide ($SiO_2$) layer, a titanium oxide ($TiO_2$) layer, or a niobium oxide ($Nb_2O_5$) layer. Alternatively, the first dielectric layer 123 may have a refractive index less than that of the second semiconductor layer 116, and may have a structure in which a plurality of layers having different refractive indices are alternately and repeatedly stacked. For example, one of the plurality of layers may be a silicon oxide ($SiO_2$) layer, and another of the plurality of layers may be a titanium oxide ($TiO_2$) layer or a niobium oxide ($Nb_2O_5$) layer. Accordingly, the first dielectric layer 123 may have an omnidirectional reflective (ODR) structure or a distributed Bragg reflective (DBR) structure.

The first sub-electrode layer 122 may cover a top surface of the first dielectric layer 123. The first sub-electrode layer 122 may extend into the third openings H3 of the first dielectric layer 123, and may contact the transparent electrode layer 121 exposed by the third openings H3. The first sub-electrode layer 122 may include a reflective metallic material, such as silver (Ag) or aluminum (Al).

The third pattern 126a of the third sub-electrode layer 126 may be coupled to the second semiconductor layer 116 through the first pattern 124a of the second sub-electrode layer 124, the first sub-electrode layer 122, and the transparent electrode layer 121. The fourth pattern 126b of the third sub-electrode layer 126 may be coupled to the first semiconductor layer 112 through the second pattern 124b of the second sub-electrode layer 124.

Figure 12:
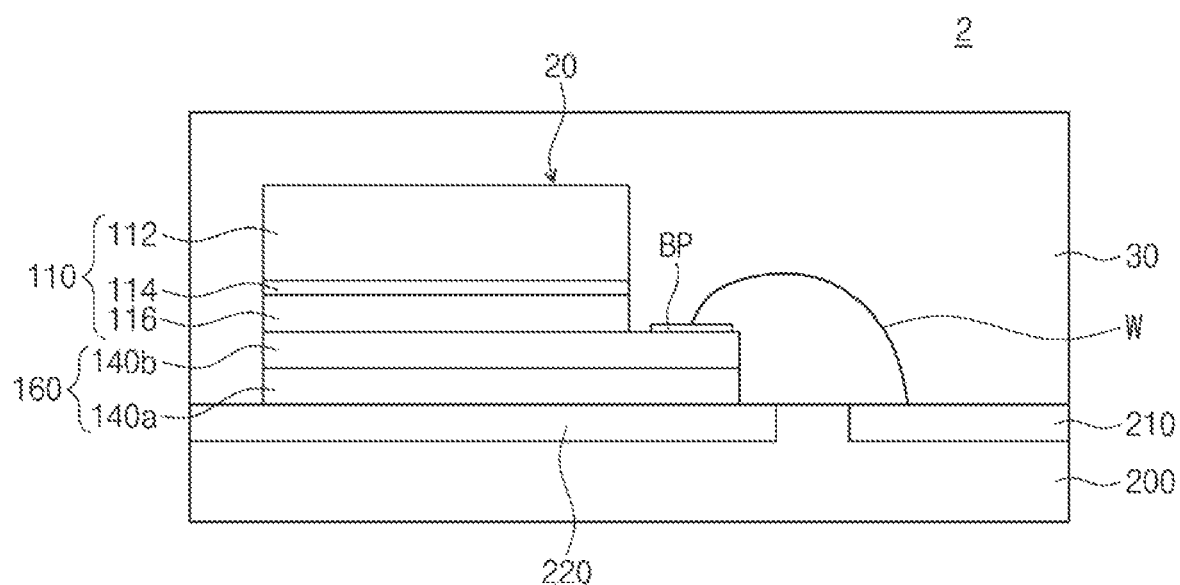
FIG. 12 illustrates a simplified cross-sectional view showing a semiconductor light emitting package according to some example embodiments.

FIG. 12 illustrates a simplified plan view showing a semiconductor light emitting package according to some example embodiments. Differences from the semiconductor light emitting package 1 of FIG. 1 will mainly be discussed for conciseness and convenience of description.

Referring to FIG. 12, a semiconductor light emitting package 2 according to some example embodiments may include a mounting substrate 200, a semiconductor light emitting device 20, and an encapsulation layer 30. The semiconductor light emitting device 20 may include a luminous structure 110 and an electrode structure 160. The luminous structure 110 may include a first semiconductor layer 112, a second semiconductor layer 116 whose conductive type is different from that of the first semiconductor layer 112, and an active layer 114 between the first and second semiconductor layers 112 and 116. The electrode structure 160 may include a first electrode 140a electrically coupled to the first semiconductor layer 112 and a second electrode 140b electrically coupled to the second semiconductor layer 116. Structures and electrical connections of the first and second electrodes 140a and 140b will further be discussed with reference to FIG. 13.

A conductive adhesive member (not shown) may be used to mount the semiconductor light emitting device 20 on a second wiring line 220 of the mounting substrate 200. The conductive adhesive member (not shown) may electrically connect the second wiring line 220 of the mounting substrate 200 to the first electrode 140a of the semiconductor light emitting device 20. In the example embodiment illustrated in FIG. 12, a portion of the luminous structure 110 may be completely removed to expose the second electrode 140b. The exposed second electrode 140b may be provided thereon with a bonding pad BP for wire bonding. A wire W may electrically connect the second electrode 140b of the semiconductor light emitting device 20 to a first wiring line 210 of the mounting substrate 200. The wire W may include, for example, gold (Au).

The encapsulation layer 30 may encapsulate the semiconductor light emitting device 20. For example, the encapsulation layer 30 may include a resin in which fluorescent substances are distributed. In some example embodiments, the fluorescent substances may include, for example, a green fluorescent substance and/or a red fluorescent substance.

An electrical signal applied to the mounting substrate 200 may cause recombination of electron-hole in the active layer 114. Light generated by the recombination of electron-hole may be upwardly discharged through the first semiconductor layer 112. The following will discuss in detail the semiconductor light emitting device 20 according to some example embodiments.

Figure 13:
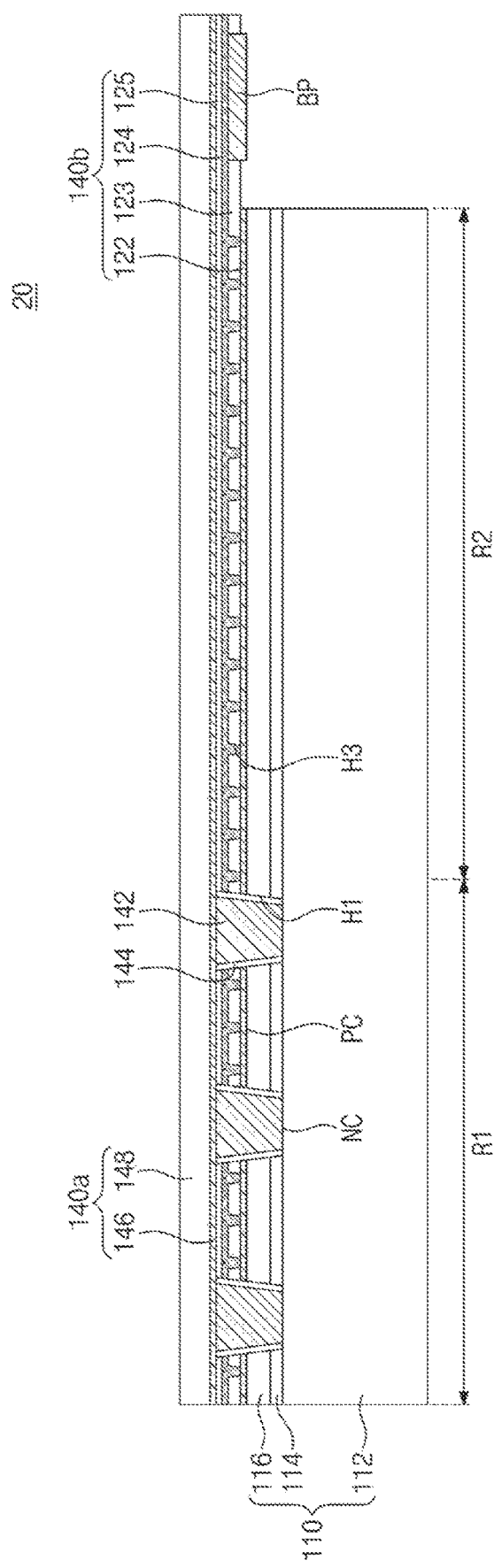
FIG. 13 illustrates a cross-sectional view showing a semiconductor light emitting device according to some example embodiments.

FIG. 13 illustrates a cross-sectional view showing a semiconductor light emitting device according to some example embodiments.

Referring to FIG. 13, the semiconductor light emitting device 20 may include the luminous structure 110 and the electrode structure (see 160 of FIG. 12). In the example embodiment illustrated in FIG. 13, no growth substrate may be provided. For example, the luminous structure 110 and the electrode structure 160 may be formed on a growth substrate that has a first region R1 and a second region R2, and then the growth substrate may be removed in fabricating the semiconductor light emitting device 20. The luminous structure 110 may include the first and second semiconductor layers 112 and 116 having different conductive types from each other and further include the active layer 114 between the first and second semiconductor layers 112 and 116. In some example embodiments, the first and second semiconductor layers 112 and 116 and the active layer 114 may each include the same material as that discussed with reference to FIGS. 2 to 6. The electrode structure 160 may include the second electrode 140b and the first electrode 140a that are sequentially stacked on the second semiconductor layer 116.

The luminous structure 110 may include one or more etching regions and a mesa region. For example, the luminous structure 110 may have one or more first openings H1 that penetrate the second semiconductor layer 116 and the active layer 114 and expose a top surface of the first semiconductor layer 112, and the etching regions may correspond to areas provided with the first openings H1 that expose the first semiconductor layer 112. The first openings H1 may be located on the first region R1. For example, the first openings H1 may be provided on the first region R1, but not on the second region R2. The first openings H1 may be two-dimensionally disposed on the first region R1. The mesa region may correspond to an area of the luminous structure 110 that is not etched when the etching regions are formed. For example, the mesa region may be an area where the first openings H1 are not formed. The second electrode 140b may include a first sub-electrode layer 122, a first dielectric layer 123, and a second sub-electrode layer 124 that are sequentially stacked on the second semiconductor layer 116. The first dielectric layer 123 may have a plurality of third openings H3, and the second sub-electrode layer 124 may be coupled through the third openings H3 to the first sub-electrode layer 122. The first sub-electrode layer 122, the first dielectric layer 123, and the second sub-electrode layer 124 may have identical or similar material and configuration, respectively, to those of the first sub-electrode layer 122, the first dielectric layer 123, and the second sub-electrode layer 124 of the semiconductor light emitting device 10 discussed with reference to FIGS. 10 and 11. The second electrode 140b may serve as a multi-layered reflective layer. The first sub-electrode layer 122 and the second semiconductor layer 116 may contact each other to form a p-contact PC.

The first electrode 140a may include a conductive adhesive layer 146 and a conductive substrate 148 that are sequentially stacked on the second electrode 140b. The conductive adhesive layer 146 may be, for example, a metal layer. When the conductive adhesive layer 146 is a metal layer, the metal layer may include, for example, one or more of Au, Ag, Pt, Ni, Cu, Sn, Al, Pb, Cr, and Ti. The conductive substrate 148 may include, for example, one of silicon, strained silicon, silicon alloys, silicon-on-insulators (SOIs), silicon carbide (SiC), silicon germanium (SiGe), silicon germanium carbide (SiGeC), germanium, germanium alloys, gallium arsenide (GaAs), indium arsenide (InAs), III-V semiconductors, and II-VI semiconductors.

A second dielectric layer 125 may be interposed between the second electrode 140b and the first electrode 140a, and thus may electrically insulate the second electrode 140b and the first electrode 140a from each other. The second dielectric layer 125 may include a silicon oxide layer.

The first electrode 140a may be electrically coupled to the first semiconductor layer 112 through a connection contact 142. The connection contact 142 may penetrate the second dielectric layer 125, the second electrode 140b, the second semiconductor layer 116, and the active layer 114, and may be disposed in the first opening H1 that exposes the first semiconductor layer 112. The connection contact 142 and the first semiconductor layer 112 may contact each other to form n-contacts NC. The connection contact 142 may include a metallic material, such as Cu, Al, or W. A dielectric spacer 144 may be disposed between the connection contact 142 and a sidewall of the first opening H1. The dielectric spacer 144 may include a silicon oxide layer or a silicon nitride layer.

The connection contact 142 may be provided in plural. For example, the first opening H1 may be provided in plural. The plurality of first openings H1 may be two-dimensionally arranged along first and second directions D1 and D2. As discussed above in FIGS. 3 to 6, areas of the first openings H1 may affect an optical efficiency of the semiconductor light emitting device 20.

Depending on positions of the first openings H1, the n-contacts NC may be located on the etching regions. For example, the n-contacts NC may be provided on the first region R1, but not on the second region R2. The n-contacts NC may be two-dimensionally disposed on the first region R1. Widths and arrangement of the n-contacts NC may affect current diffusion and light extraction efficiency. The widths and arrangement of the n-contacts NC may be restricted to improve current diffusion and light extraction efficiency. For example, the p-contact PC may be formed on an entire top surface of the luminous structure 110 on the first and second regions R1 and R2 except for where the first openings H1 are formed, and the n-contacts NC may be provided with a uniform density on the first region R1. Therefore, the luminous structure 110 may generate light with brightness that is uniform on the first region R1 and that gradually decreases in the first direction D1 on the second region R2 as a distance from the first region R1 increases. Accordingly, the semiconductor light emitting device 20 may have a gradation effect on the second region R2.

A portion of the luminous structure 110 may be completely removed to expose the second electrode 140b. In this configuration, the first sub-electrode layer 122 may also be removed to expose the first dielectric layer 123. The exposed first dielectric layer 123 may be provided thereon with a bonding pad BP for wire bonding. The bonding pad BP may penetrate the first dielectric layer 123 and may be coupled to the second sub-electrode layer 124. The bonding pad BP may correspond to the bonding pad BP discussed with reference to FIG. 12. A wire W may electrically connect the second electrode 140b of the semiconductor light emitting device 20 to a first wiring line (see 210 of FIG. 2) of a mounting substrate (see 200 of FIG. 2). The wire W may include, for example, gold (Au). FIG. 13 shows that the bonding pad BP is formed on the second region R2, but example embodiments are not limited thereto. In some example embodiments, the bonding pad BP may be formed on the second electrode 140b that is exposed by removing the luminous structure 110 on the first region R1.

Figure 14:
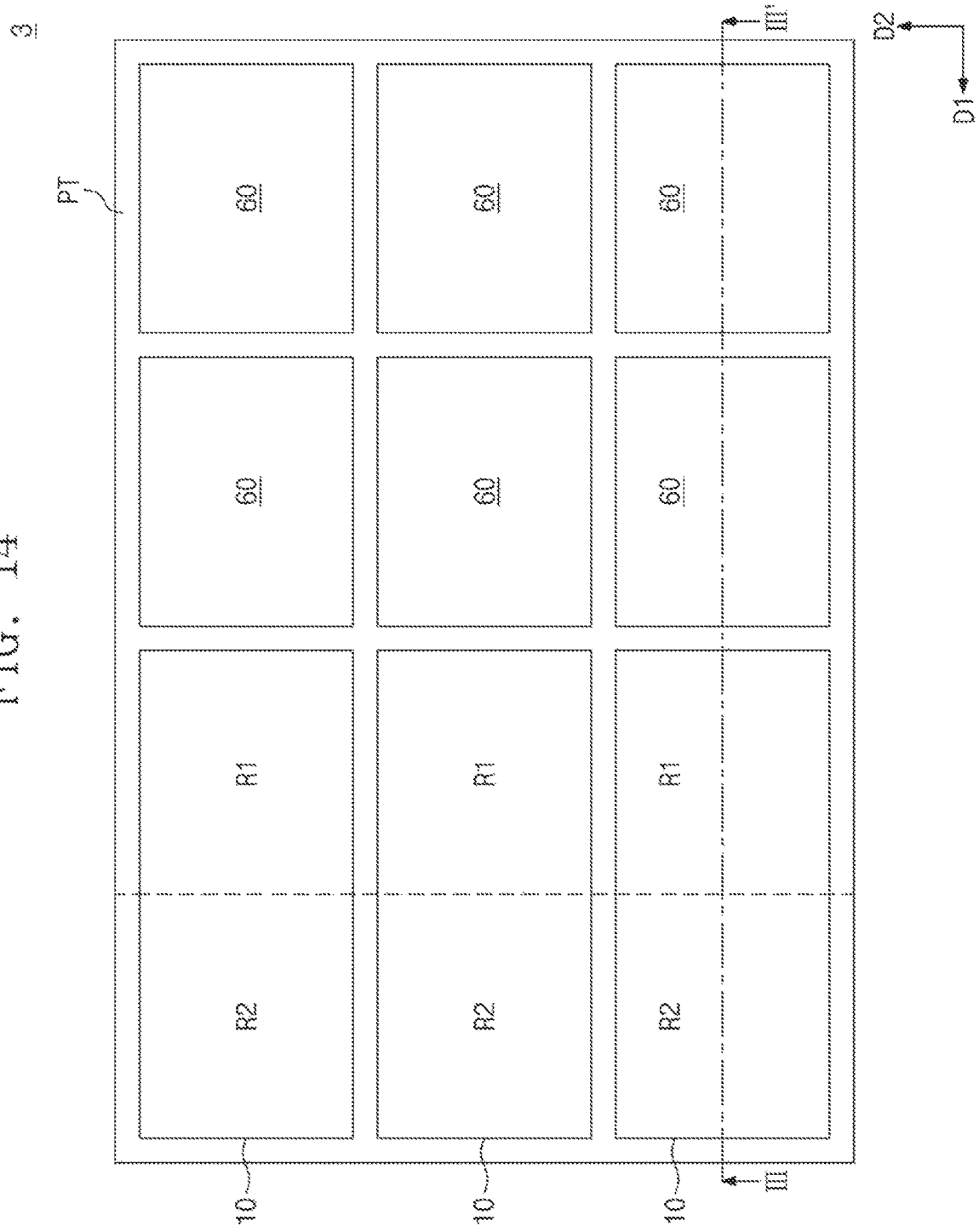
FIG. 14 illustrates a simplified plan view showing a semiconductor light emitting package according to some example embodiments.
Figure 15:
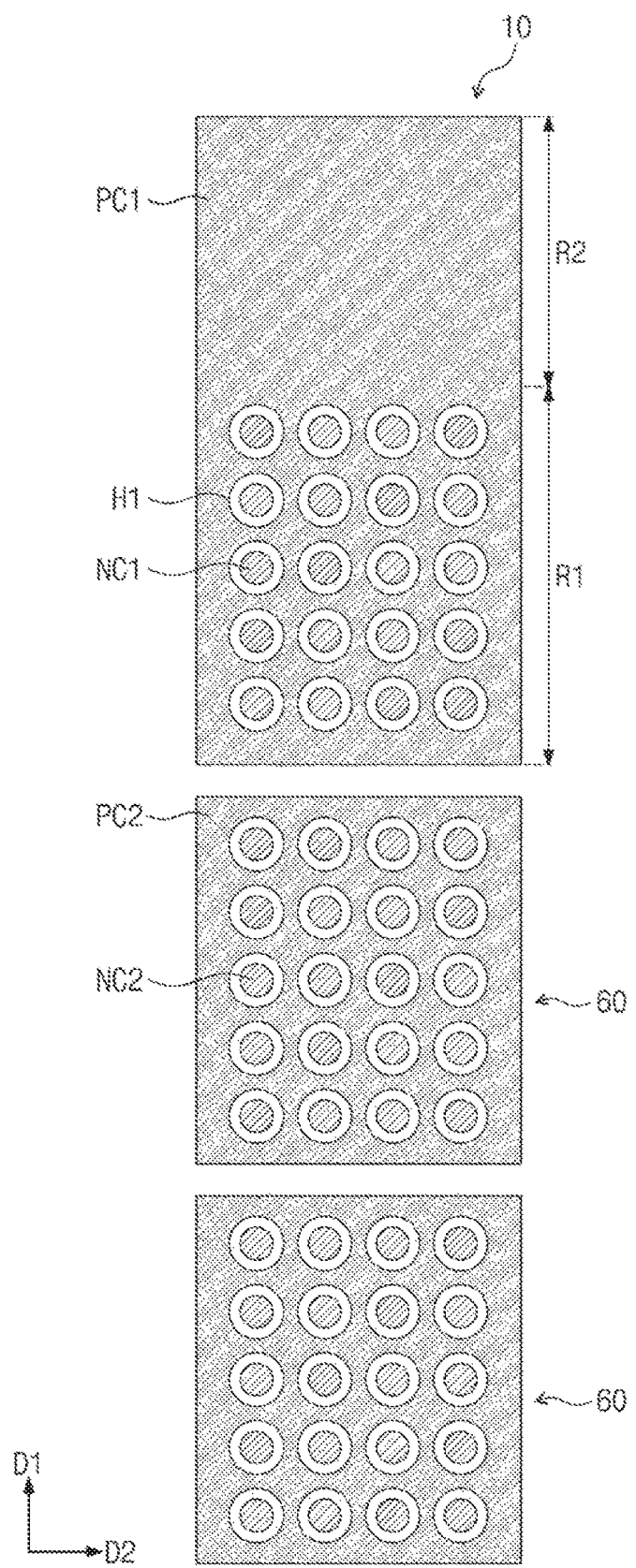
FIG. 15 illustrates a simplified plan view showing first semiconductor light emitting devices and second light emitting devices.
Figure 16:
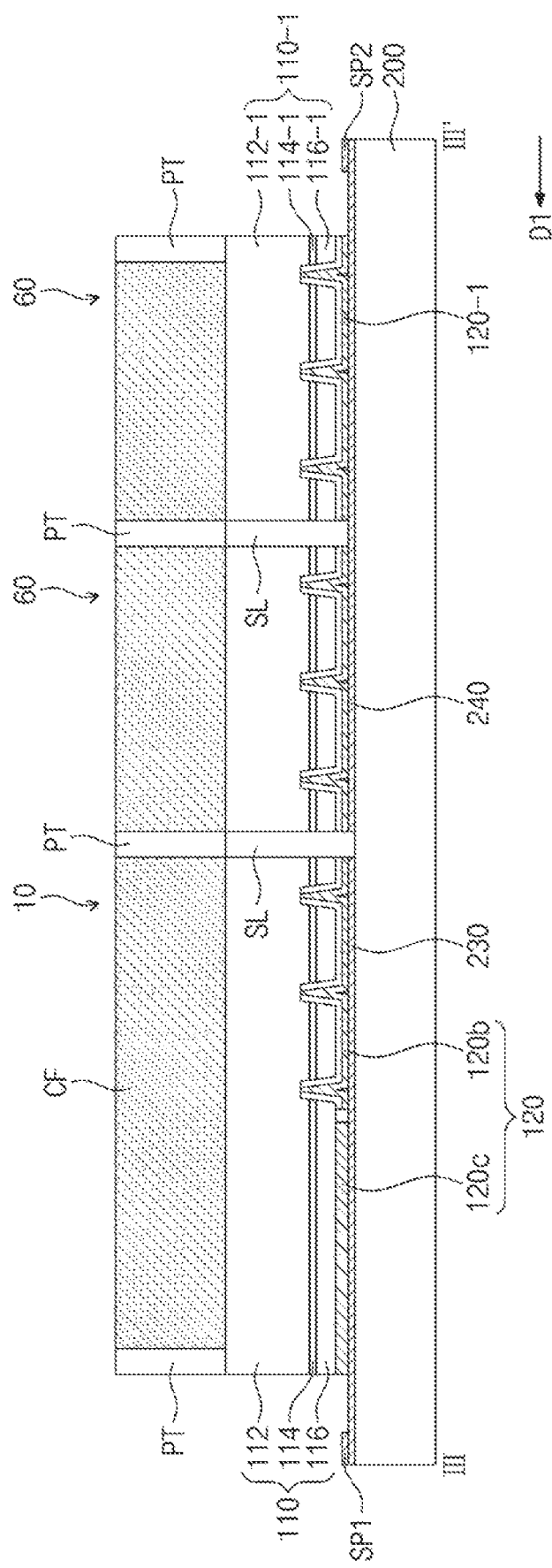
FIG. 16 illustrates a cross-sectional view showing a semiconductor light emitting package according to some example embodiments.

FIG. 14 illustrates a simplified plan view showing a semiconductor light emitting package according to some example embodiments. FIG. 15 illustrates a simplified plan view showing first semiconductor light emitting devices that are arranged in a first direction on a single column and second semiconductor light emitting devices that are arranged in the first direction on a single column, and further showing arrangement of n-contacts and p-contacts of the first and second semiconductor light emitting devices. FIG. 16 illustrates a cross-sectional view taken along line III-III' of FIG. 14, showing a semiconductor light emitting package according to some example embodiments.

Referring to FIGS. 14 to 16, a semiconductor light emitting package 3 may include a mounting substrate 200, first semiconductor light emitting devices 10, and second semiconductor light emitting devices 60.

The mounting substrate 200 may be a package substrate or a motherboard of an external device. The mounting substrate 200 may be a printed circuit board (PCB). Although not shown, various semiconductor devices, such as transistors, may be integrated on the mounting substrate 200. The mounting substrate 200 may have on a top surface thereof third wiring lines 230 for electrical connection of the first semiconductor light emitting devices 10 and fourth wiring lines 240 for electrical connection of the second semiconductor light emitting devices 60. The third wiring lines 230 may have at ends thereof a plurality of first substrate pads SP1 for connection with the semiconductor devices, and the fourth wiring lines 240 may have at their ends a plurality of second substrate pads SP2 for connection with the semiconductor devices as illustrated in FIG. 16.

The first semiconductor light emitting devices 10 and the second semiconductor light emitting devices 60 may be mounted on the mounting substrate 200. The second semiconductor light emitting devices 60 may be arranged along a first direction D1 and a second direction D2 that intersects (e.g., orthogonal to) the first direction D1 to constitute a plurality of rows and columns. The first semiconductor light emitting devices 10 may be disposed in the first direction D1 on the same sides of the second semiconductor light emitting devices 60. The first semiconductor light emitting devices 10 may each be located in the first direction D1 on one side of the second semiconductor light emitting device 60, and may be arranged in the second direction D2 as illustrated in FIG. 14.

The second semiconductor light emitting devices 60 may have no gradation effect. For example, as shown in FIG. 15, the p-contact PC2 of the second semiconductor light emitting devices 60 may be formed to cover entire top surfaces of the second semiconductor light emitting devices 60 (except where the holes are formed), and the n-contacts NC2 of the second semiconductor light emitting devices 60 may be provided to have a uniform density on an area on which the p-contact PC2 is provided. Identically to the first region R1 of the first semiconductor light emitting device 10 discussed with reference to FIGS. 2 to 6, the n-contacts NC2 of the second semiconductor light emitting devices 60 may be uniformly provided on the entire top surfaces of the second semiconductor light emitting devices 60. Accordingly, the second semiconductor light emitting devices 60 may emit light whose brightness is the same regardless of position when viewed in plan view.

The first semiconductor light emitting devices 10 may be the same as the semiconductor light emitting device 10 that has the gradation effect with reference to FIGS. 2 to 11. For example, as shown in FIG. 15, the p-contact PC1 of the first semiconductor light emitting devices 10 may be formed to cover entire top surfaces of the first semiconductor light emitting devices 10 except where the first openings H1 are formed, and may be provided on the first region R1 on which the n-contacts NC1 of the first semiconductor light emitting devices 10 are uniformly disposed and the second region R2 which is placed in the first direction D1 from the first region R1 and on which the n-contacts NC1 are not placed. Therefore, the first semiconductor light emitting devices 10 may emit light with brightness that gradually decreases in the first direction D1. For example, the first semiconductor light emitting devices 10 may have their brightness that gradually decreases with increasing distance in the first direction D1 from the second semiconductor light emitting devices 60. A sum of areas of the n-contacts NC1 (and thus the first openings H1) per unit area provided on the first region R1 may be the same as a sum of areas of the n-contacts NC2 (an thus the associated openings) per unit area of the second semiconductor light emitting device 60. For example, brightness of light emitted from the second semiconductor light emitting device 60 may be the same as brightness of light emitted from the first region R1 of the first semiconductor light emitting device 10, and brightness of light emitted from the second region R2 of the first semiconductor light emitting device 10 gradually decreases in the first direction D1 on the second region R2. Accordingly, the semiconductor light emitting package 3 may be configured such that light with uniform brightness is emitted from an area where the second semiconductor light emitting devices 60 are provided, and that light with gradually reduced brightness is emitted from an outer area where the first semiconductor light emitting devices 10 are provided. FIG. 14 shows that the first semiconductor light emitting devices 10 are provided on an area that is separated in the first direction D1 from an area where the second semiconductor light emitting devices 60 are provided, but example embodiments are not limited thereto. The second semiconductor light emitting devices 60 may be provided on a central portion of the semiconductor light emitting package 3 and thus may emit light with uniform brightness, and the first semiconductor light emitting devices 10 may be provided on an outer edge of the semiconductor light emitting package 3 and thus may emit light with brightness that gradually decreases as approaching the outer edge of the semiconductor light emitting package 3.

The first semiconductor light emitting device 10 may include a first luminous structure 110 and a first electrode structure 120. The first luminous structure 110 may include first and second semiconductor layers 112 and 116 having different conductive types and an active layer 114 between the first and second semiconductor layers 112 and 116. The first electrode structure 120 may include a first electrode 120c electrically coupled to the second semiconductor layer 116 and a second electrode 120d electrically coupled to the first semiconductor layer 112. The first electrode 120c and the second electrode 120d may be identical or similar to those discussed with reference to FIGS. 1 to 7.

The second semiconductor light emitting device 60 may include a second luminous structure 110-1 and a second electrode structure 120-1. The second luminous structure 110-1 may include first and second semiconductor layers 112-1 and 116-1 having different conductive types and an active layer 114-1 between the first and second semiconductor layers 112-1 and 116-1. The second electrode structure 120-1 may include a first electrode electrically coupled to the second semiconductor layer 116-1 and a second electrode electrically coupled to the first semiconductor layer 112-1. Although FIG. 16 roughly shows the second electrode structure 120-1 for conciseness and convenience of description, as discussed with reference to FIG. 15, the first electrode that constitutes the p-contact PC2 may be formed to cover an entire top surface of the second semiconductor layer 116-1 (except forwhere the holes are formed), and the second electrode that constitutes the n-contact NC2 may be provided to have a uniform density on an area where the p-contact PC2 is provided.

The first electrode structure 120c and 120d of the first semiconductor light emitting device 10 may be connected to the third wiring lines 230 of the mounting substrate 200, and the second electrode structure 120-1 of the second semiconductor light emitting device 60 may be connected to the fourth wiring lines 240 of the mounting substrate 200. For example, the first and second electrodes 120c and 120d of the first semiconductor light emitting devices 10 may be coupled to the third wiring lines 230 of the mounting substrate 200, and the second electrode structures 120-1 of the second semiconductor light emitting devices 60 may be coupled to the fourth wiring lines 240 of the mounting substrate 200. The third wiring lines 230 may include the first wiring lines 210 and the second wiring lines 220 that are discussed with reference to FIG. 2. Although not shown, connection terminals such as solder bumps may be used to mount the first and second semiconductor light emitting devices 10 and 60 on the mounting substrate 200.

A separation layer SL may be interposed between neighboring ones of the first and second semiconductor light emitting devices 10 and 60. The separation layer SL may separate the first and second semiconductor light emitting devices 10 and 60 from each other, and may separate the second semiconductor light emitting devices 60 from each other, and may insulate the first and second semiconductor light emitting devices 10 and 60, with the result that the first and second semiconductor light emitting devices 10 and 60 may independently operate as individual light emitting devices.

Wavelength conversion layers CF may be provided on the first and second semiconductor light emitting devices 10 and 60. When the semiconductor light emitting package 3 operates, the wavelength conversion layers CF may convert light emitted from the first and second semiconductor light emitting devices 10 and 60 into desired wavelengths. The wavelength conversion layers CF may include a wavelength conversion material. The wavelength conversion material may convert light having a wavelength generated from the first and second semiconductor light emitting devices 10 and 60. For example, the wavelength conversion material may include a quantum-dot fluorescent material, which has a nano-sized particle. The quantum-dot fluorescent material may use a III-V or II-VI compound semiconductor to have a core-shell structure. For example, the core may include CdSe and/or InP. The shell may include ZnS and/or ZnSe. In addition, the quantum-dot fluorescent material may include a ligand to increase stability of the core and the shell. For another example, additional wavelength conversion particles may further be provided on an upper portion of one or more of the fluorescent layers CF.

A partition structure PT may be interposed between the wavelength conversion layers CF. The partition structure PT may shield light so as to prevent mixing of light generated from the first and second semiconductor light emitting devices 10 and 60. The partition structure PT may define pixel openings. For example, the pixel openings may be provided in and surrounded by the partition structure PT. The partition structure PT may divide the pixel openings from each other. Each of the pixel openings may be defined as a single pixel.

The third wiring lines 230 may extend outwardly from the first semiconductor light emitting devices 10, and the fourth wiring lines 240 may extend outwardly from the second semiconductor light emitting devices 60. The third wiring lines 230 may be coupled to corresponding first substrate pads SP1 located outside the first semiconductor light emitting devices 10, and the fourth wiring lines 240 may be coupled to corresponding second substrate pads SP2 located outside the second semiconductor light emitting devices 60. The first substrate pads SP1 may serve as coupling terminals that supply the first semiconductor light emitting devices 10 with electrical signals from one or more semiconductor devices integrated on the mounting substrate 200, and the second substrate pads SP2 may serve as coupling terminals that supply the second semiconductor light emitting devices 60 with electrical signals from one or more semiconductor devices integrated on the mounting substrate 200.

Because the first semiconductor light emitting devices 10 that generate light with the gradation effect are disposed in the first direction D1 on the same sides of the second semiconductor light emitting devices 60 that generate light with uniform brightness, the semiconductor light emitting package 3 may emit light that gradually decreases in the first direction D1 on the outer edge thereof. According to some example embodiments, it may be possible to provide a semiconductor light emitting device that is configured to generate light with uniform brightness on a region thereof and to generate light with gradation effect on other region thereof.

According to some example embodiments, a semiconductor light emitting device may not include n-contacts on a second region, and thus a magnitude of power applied to a luminous structure may decrease with increasing distance from the n-contacts on the second region. Therefore, the luminous structure may generate light with uniform brightness on a first region, and the brightness of light generated from the luminous structure on the second region may gradually decrease in a first direction. The semiconductor light emitting device may thus have a gradation effect on the second region. In this sense, according to various example embodiments, even when there is no power control based on position, widths and arrangement of the n-contacts and the p-contact may be used to achieve the gradation effect.

Although the present inventive concept has been described in connection with the some example embodiments illustrated in the accompanying drawings, it will be understood by one of ordinary skill in the art that variations in form and detail may be made therein without departing from the spirit and scope of the appended claims. The above disclosed embodiments should thus be considered illustrative and not restrictive.

What is claimed is:

1. A semiconductor light emitting device comprising:
a substrate having a first region and a second region that is spaced apart in a first direction from the first region;
a luminous structure including a first semiconductor layer, an active layer, and a second semiconductor layer that are sequentially stacked on the substrate;
a first electrode on the second semiconductor layer; and
a second electrode electrically coupled to the first semiconductor layer through first openings that penetrate the first electrode, the second semiconductor layer, and the active layer, the first openings exposing the first semiconductor layer,
wherein the first electrode is in contact with the second semiconductor layer in the first region and in the second region,
wherein the first openings are arranged in rows that extend in a second direction perpendicular to the first direction and the rows are spaced apart from each other in the first region but are not in the second region, and
wherein a length of the second region in the first direction is about 1.5 to 20 times an interval between the first openings in the second direction such that the luminous structure generates a light with a brightness that is uniform on the first region and gradually decreases in the first direction on the second region.

2. The semiconductor light emitting device of claim 1, wherein a sum of areas of the first openings per row in the first region gradually decreases as the rows become closer to the second region in the first direction.

3. The semiconductor light emitting device of claim 2, wherein a density of the first openings per row gradually deceases as the rows become closer to the second region in the first direction.

4. The semiconductor light emitting device of claim 2, wherein an area of each of the first openings per row gradually decreases as the rows become closer to the second region in the first direction.

5. The semiconductor light emitting device of claim 1, wherein the first electrode includes a plurality of second openings in the second region, the plurality of second openings vertically penetrating the first electrode.

6. The semiconductor light emitting device of claim 1, wherein the luminous structure includes a mesa region and an etching region that has a length in the first direction less than a length in the first direction of the mesa region, the etching region exposing the first semi conductor layer,
wherein, in the etching region, the second electrode penetrates the first openings and directly contacts the first semiconductor layer.

7. The semiconductor light emitting device of claim 1, wherein the second electrode penetrates the first electrode, the second semiconductor layer, and the active layer in the first openings to contact the first semiconductor layer,
wherein the contact between the second electrode and the first semiconductor layer in the first openings form a plurality of contacts, respectively, in the first openings.

8. A semiconductor light emitting device comprising:
a luminous structure including a first semiconductor layer, an active layer, and a second semiconductor layer that are sequentially stacked, wherein the luminous structure has a first region and a second region that is spaced apart in a first direction from the first region;
a first electrode on the second semiconductor layer, wherein the first electrode and the second semiconductor layer are in contact with each other to constitute a first contact; and
a plurality of second electrodes that penetrate the second semiconductor layer and the active layer in the first region, wherein the plurality of second electrodes and the first semiconductor layer are in contact with each other to constitute second contacts,
wherein the plurality of second electrodes are arranged in rows that extend in a second direction perpendicular to the first direction, the rows being spaced apart from each other in the first direction, and
wherein, when viewed in plan view, a sum of areas of the plurality of second electrodes per row in the first region gradually decreases as the rows become closer to the second region in the first direction such that the luminous structure generates a light with a brightness that is uniform on the first region and gradually decreases in the first direction on the second region.

9. The semiconductor light emitting device of claim 8, wherein
the second contacts have the same planar shape, and
a density of the second contacts per row in the first region gradually decreases as the rows become closer to the second region in the first direction.

10. The semiconductor light emitting device of claim 8, wherein
a number of the second contacts per row in the first region is the same in each row, and
an area of each of the second contacts in the first region gradually decreases as the rows become closer to the second region in the first direction.

11. The semiconductor light emitting device of claim 8, wherein the plurality of second electrodes are in the first region, but not in the second region.

12. The semiconductor light emitting device of claim 11, wherein the first electrode includes a plurality of second openings in the second region.

13. The semiconductor light emitting device of claim 12, wherein, when viewed in plan view, each of the plurality of second openings has a circular shape, or a linear shape that extends in the first direction.

14. A semiconductor light emitting package comprising:
a substrate;
a first semiconductor light emitting device on the substrate; and
a second semiconductor light emitting device on the substrate, the second semiconductor light emitting device being adjacent in a first direction to the first semiconductor light emitting device,
wherein the first semiconductor light emitting device includes:
a first luminous structure that includes a first semiconductor layer, a first active layer, and a second semiconductor layer, the first luminous structure having a first region that is adjacent to the second semiconductor light emitting device and a second region that is located in the first direction on one side of the first region;
a first electrode on the second semiconductor layer; and
a plurality of second electrodes in the first region, the plurality of second electrodes being in first openings that penetrate the second semiconductor layer and the first active layer, the first openings exposing the first semiconductor layer, and wherein the second semiconductor light emitting device includes:
- a second luminous structure that includes a third semiconductor layer, a second active layer, and a fourth semiconductor layer;
- a third electrode on the fourth semiconductor layer; and
- a plurality of fourth electrodes in a plurality of second openings that penetrate the fourth semiconductor layer and the second active layer, the plurality of second openings exposing the third semiconductor layer, wherein the first openings are arranged in rows that extend in a second direction perpendicular to the first direction and the rows are spaced apart from each other in the first direction, wherein, when viewed in plan view, a sum of areas of the first openings per row in the first region of the first semiconductor light emitting device gradually increases as the rows become closer to the second semiconductor light emitting device in the first direction, wherein a length of the second region in the first direction is about 1.5 to 20 times an interval between the first openings in the second direction such that the first luminous structure generates a light with a brightness that is uniform on the first region and gradually decreases in the first direction on the second region.

15. The semiconductor light emitting package of claim 14, wherein a density of the first openings per row gradually increases as the rows become closer to the second semiconductor light emitting device in the first direction.

16. The semiconductor light emitting package of claim 14, wherein:
- a number of the first openings per row is constant, and
- an area of each of the first openings gradually increases as the rows become closer to the second semiconductor light emitting device in the first direction.

17. The semiconductor light emitting package of claim 14, wherein the first openings are not in the second region.

* * * * *